US006346365B1

(12) United States Patent
Kawauchi et al.

(10) Patent No.: US 6,346,365 B1
(45) Date of Patent: Feb. 12, 2002

(54) METHOD OF FORMING A POSITIVE IMAGE ON A LITHOGRAPHIC PRINTING PLATE USING AN INFRARED LASER

(75) Inventors: Ikuo Kawauchi; Takeshi Kimura, both of Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 09/583,224

(22) Filed: May 30, 2000

Related U.S. Application Data

(63) Continuation of application No. 09/152,064, filed on Sep. 11, 1998, now Pat. No. 6,117,613.

(30) Foreign Application Priority Data

| | | |
|---|---|---|
| Sep. 12, 1997 | (JP) | 9-248889 |
| Sep. 25, 1997 | (JP) | 9-259703 |
| May 14, 1998 | (JP) | 10-132365 |
| Aug. 13, 1998 | (JP) | 10-229099 |

(51) Int. Cl.[7] ............ G03F 7/039
(52) U.S. Cl. ............ 430/302; 430/270.1; 430/281.1
(58) Field of Search ............ 430/270.1, 302, 430/273.1, 281.1, 283.1, 944, 945; 101/463.1, 467

(56) References Cited

U.S. PATENT DOCUMENTS

| | | | | | |
|---|---|---|---|---|---|
| 3,645,733 | A | | 2/1972 | Brinckman et al. | 96/36 |
| 4,708,925 | A | | 11/1987 | Newman | 430/270 |
| 4,789,619 | A | | 12/1988 | Ruckert et al. | 430/270 |
| 5,466,557 | A | | 11/1995 | Haley et al. | 430/278 |
| 5,731,123 | A | | 3/1998 | Kawamura et al. | 430/176 |
| 5,807,659 | A | | 9/1998 | Nishimiya et al. | 430/302 |
| 5,814,431 | A | | 9/1998 | Nagasaka et al. | 430/281.1 |
| 5,824,451 | A | | 10/1998 | Aoai et al. | 430/270.1 |
| 5,840,467 | A | | 11/1998 | Kitatani et al. | 430/302 |
| 6,017,677 | A | * | 1/2000 | Maemoto et al. | 430/270.1 |
| 6,060,218 | A | * | 5/2000 | Van Damme et al. | 430/302 |
| 6,060,222 | A | * | 5/2000 | West et al. | 430/326 |
| 6,083,662 | A | * | 7/2000 | Miller et al. | 430/302 |
| 6,083,663 | A | * | 7/2000 | Vermeersch et al. | 430/302 |
| 6,090,532 | A | * | 7/2000 | West et al. | 430/326 |
| 6,096,479 | A | * | 8/2000 | Kawamura et al. | 430/270.1 |
| 6,117,610 | A | * | 9/2000 | Sheriff et al. | 430/190 |
| 6,132,929 | A | * | 10/2000 | Nakamura et al. | 430/270.1 |
| 6,140,022 | A | * | 10/2000 | Van Damme et al. | 430/302 |
| 6,143,464 | A | * | 11/2000 | Kawauchi | 430/270.1 |
| 6,153,353 | A | * | 11/2000 | Van Damm et al. | 430/270.1 |
| 6,232,038 | B1 | * | 5/2001 | Takasaki et al. | 430/281.1 |
| 6,280,899 | B1 | * | 8/2001 | Parsons et al. | 430/270.1 |

FOREIGN PATENT DOCUMENTS

| | | | |
|---|---|---|---|
| EP | 0761429 | | 3/1997 |
| EP | 0780239 | | 6/1997 |
| JP | 7-285275 | | 10/1995 |
| JP | 9-043847 | * | 2/1997 |
| WO | WO97/39894 | | 10/1997 |
| WO | WO 97/239894 | * | 10/1997 |

* cited by examiner

*Primary Examiner*—Janet Baxter
*Assistant Examiner*—Barbara Gilmore
(74) *Attorney, Agent, or Firm*—Burns, Doane, Swecker & Mathis, LLP

(57) ABSTRACT

A method for forming a positive image by exposing a photosensitive lithographic printing plate with an infrared laser in the range of 700 to 1200 nm, the photosensitive lithographic printing plate having a substrate and a positive photosensitive composition thereon with the positive photosensitive composition having defined components including an alkali aqueous solution soluble polymer compound or resin.

19 Claims, No Drawings

METHOD OF FORMING A POSITIVE IMAGE ON A LITHOGRAPHIC PRINTING PLATE USING AN INFRARED LASER

This application is a continuation, of Application Ser. No. 09/152.064, filed Sep. 11, 1998 U.S. Pat. No. 6,117,613.

BACKGROUND OF THE INVENTION

1. Field of the Invention

The present invention relates to an image forming material which can be used as an offset printing master, and in particular to a positive photosensitive composition for use with an infrared laser which is used in so-called computer-to-plate printing in which an offset printing plate is formed directly on the basis of digital signals from a computer or the like.

2. Description of the Related Art

Conventionally, computer-to-plate methods have been known which directly form an offset printing plate on the basis of digital data from a computer. Examples of such methods include (1) an electrophotographic method, (2) a photopolymerization method based on the combination of exposure by an Ar laser and post-heating, (3) a method in which a silver salt sensitive material is deposited on a photosensitive resin, (4) a method using a silver master and (5) a method in which a silicone rubber layer is decomposed by discharge breakdown or a laser beam.

However, in the electrophotographic method (1), processings such as charging, exposure and development are complicated, and the device used for the processings is also complicated and large-scale. In the method (2), the post-heating step is required. Further, a highly sensitive plate material is also required, and handling thereof in a light room is difficult. In methods (3) and (4), silver salts are used and thus the processing in the methods is complicated and the cost is high. Method (5) is a relatively complete method, but there remains a problem in that silicone dust remaining on the surface of the offset printing plate must be removed.

Recently, lasers have been remarkably developed. In particular, solid state lasers and semiconductor lasers, which have a luminous band from near infrared ray wavelengths to infrared ray wavelengths and which are small-sized and have a high energy output, can be easily obtained. These lasers are very useful as a light source for exposure when an offset printing plate is directly formed on the basis of digital data from a computer or the like.

In conventional positive lithographic printing plates for an infrared laser which are used in the computer-to-plate system, a resin which is soluble in an alkali aqueous solution and has a phenolic hydroxide group, such as novalak resin, is used as a polymer compound which is soluble in an alkali aqueous solution (hereinafter, alkali aqueous solution soluble polymer compound) As such a recording material, for example, Japanese Patent Application Laid-Open (JP-A) No. 7-285275 discloses image recording materials in which a material absorbing light to generate heat, and various onium salts, quinonediazide compounds or the like are added to an alkali aqueous solution soluble resin having a phenolic hydroxide group, such as novalak resin. In these image recording materials, onium salts, quinonediazide compounds or the like function as a dissolution-inhibiting agent for substantially lowering the solubility of the alkali aqueous solution soluble resin in image portions. On the contrary, the onium salts, quinonediazide compounds or the like are decomposed by heat in non-image portions and their dissolution-inhibiting ability is not exhibited, so that they can be removed altogether with the alkali aqueous solution soluble resin by development, thus allowing formation of images.

In such image recording materials, onium salts, quinonediazide compounds or the like have a light absorbing band (350–500 nm) within the visible ray range. Thus, inconveniently, they can only be handled under yellow lights. The onium salts or the like are decomposed by heat, so as to form non-image portions. Therefore, it is necessary to provide them with energy sufficient for their decomposition, and the decomposed onium salts inevitably react and recombine with the novalak resin. Thus, there are limits to the improvement in sensitivity.

The onium salts, the quinonediazide compounds or the like are not necessarily highly compatible with the alkali aqueous solution soluble polymer compound or the material absorbing light to generate heat. Thus, it is difficult to prepare a uniform coating solution and to obtain a uniform and stable material for lithographic printing plates.

Among conventional materials for positive lithographic printing plates for infrared lasers, there are materials which comprises as essential components an alkali aqueous solution soluble binder resin (without using onium salts, quinonediazide compounds, or the like), an IR dye which absorbs light and generates heat, and the like. The IR dye or the like functions a dissolution-inhibiting agent which, in non-exposed portions (image portions), interacts with the binder resin to lower the solubility of the binder resin substantially. In exposed portions (non-image portions), the interaction of the IR dye or the like with the binder resin is weakened by the generated heat, so that the binder resin is dissolved in an alkali developing solution, thus allowing formation of a lithographic printing plate.

However, the IR dye or the like functions only as a dissolution-inhibiting agent in the non-exposed portions (the image portions), and does not promote the dissolution of the binder resin in the exposed portions (the non-image portions) Although the onium salts, the quinonediazide compounds or the like interact with the binder resin in non-exposed portions (image portions) to function as the dissolution-inhibiting agent, they are decomposed by light in the exposed portions (non-image portions) and generate an acid so as to function as a dissolution-promoting agent.) Accordingly, in the case of the IR dyes or the like, in order to obtain a difference between the non-exposed portions and the exposed portions, there is no choice but to use a resin having high solubility in an alkali developing solution as the binder resin thereby resulting in the problem that the state before development is not stable.

SUMMARY OF THE INVENTION

Therefore, the object of the present invention is to provide a positive photosensitive composition for use with an infrared laser which is used in a "computer-to-plate" system and has advantages in that the image forming capability of a recording layer comprising an alkali aqueous solution soluble polymer compound is improved, places in which the composition can be handled are not restricted, handling of the composition is easy because of the stability of the state before development, and the stability of sensitivity against changes in the concentration of a developing solution, that is, the development latitude, is good.

The inventors have studied such compositions, and found that a specific combination of an alkali aqueous solution soluble polymer compound and a compound for controlling the solubility of the polymer compound in an alkali aqueous solution improves the solvent-resistance and development latitude to a large extent, and thus arrived at the present invention.

According to the first aspect of the present invention, a positive photosensitive composition for use with an infrared laser comprises one or more alkali aqueous solution soluble polymer compounds (A) having at least one group selected from a phenolic hydroxide group (a-1), a sulfonamide group (a-2), and an active imide group (a-3); a compound (B) which has an I/O value (Y) satisfying the relationship $0.05 \leqq |X-Y| \leqq 0.5$ (inequality (1)), in which X is the I/O value of the alkali aqueous solution soluble polymer compound (A), and which is compatible with the polymer compound (A) thereby lowering the solubility of the polymer compound (A) into an alkali aqueous solution, the effect of lowering the solubility being reduced by heating; and a compound (C) which generates heat upon absorbing light. The photosensitive composition dose not contain any compound having a thermal decomposition temperature of 150° C. or less.

Compound (B) has an I/O value (Y), whose relationship with the I/O value (X) of the alkali aqueous solution soluble polymer compound satisfies the above inequality (1). Further, compound (B) is compatible with the alkali aqueous solution soluble polymer compound, thereby lowering the solubility of the alkali aqueous solution soluble polymer compound. This effect of lowering the solubility is reduced by heating. Compound (C) generates heat upon absorption of light. In place of using compound (B) and compound (C), the composition of the present invention can contain a compound having the characteristics of both compound (B) and compound (C).

In the first aspect, there are combined the alkali aqueous solution soluble polymer compound (A); compound (B) which has in the molecule a group able to interact with the alkali aqueous solution soluble polymer compound (A), and which has an I/O value (Y) whose relationship with the I/O value (X) of the alkali aqueous solution soluble polymer compound satisfies the aforementioned inequality (1), and which is compatible with the polymer compound (A) thereby lowering the solubility of the polymer (A) in an alkali aqueous solution, this effect of lowering the solubility being reduced by heating; and compound (C) which absorbs light so as to generate heat.

As described above, the compound (B) has an I/O value (Y) whose relationship with the I/O value (X) of the alkali aqueous solution soluble polymer compound satisfies the aforementioned inequality (1). Compound (B) is compatible with the polymer compound (A), thereby lowering the solubility of the polymer compound (A) in an alkali aqueous solution. The effect of lowering the solubility is reduced by heating. Thus, compound (B) is uniformly compatible with the alkali aqueous solution soluble polymer compound (A) so as to form a uniform recording layer (coating layer), thereby reducing the solubility of the component (A) in an alkali aqueous solution.

When an infrared laser is radiated, at exposed portions, heat is generated by the compound (C) absorbing light so as to generate heat, and consequently, the component (compound) (A) and the component (compound) (B) separate. Thus, the dissolution-inhibiting ability caused by the interaction deteriorates, and the compound (A) in the exposed portions is removed by an alkali aqueous solution which is a developing solution, and images are formed.

The mechanism by which this function is exhibited is unclear, but is assumed to be as follows. The component (A) and the component (B) are compatible with each other and form a uniform layer. Consequently, strong interaction based on hydrogen bonding or the like is caused between the molecules of both, so that the recording layer is insoluble in an alkali aqueous solution. When the recording layer composition is heated, it becomes fluid again by heat so that the interaction is weakened. As a result, the solubility of the component (A) in an alkali aqueous solution, which is an original characteristic of the component (A), is restored.

In the present invention, as mentioned above, compound (B) has an I/O value (Y), whose relationship with the I/O value (X) of the alkali aqueous solution soluble polymer compound (A) satisfies the above inequality (1), and compound (B) is compatible with the alkali aqueous solution soluble polymer compound, thereby lowering the solubility of the alkali aqueous solution soluble polymer compound. This effect of lowering the solubility is reduced by heating. Compound (C) generates heat upon absorbing light. However, in place of using compound (B) and compound (C), the composition of the present invention can contain a compound having the characteristics of both compound (B) and compound (C). The compound represented by the following general formula (I) may be used as the compound having the characterristics of both compound (B) and compound (C).

General formula (I)

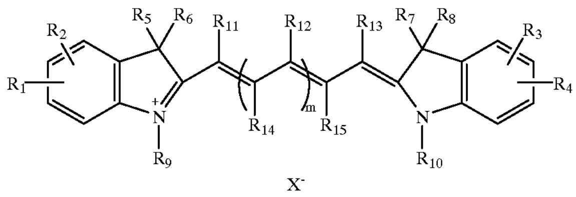

in which $R^1$–$R^4$ each independently represents an alkyl group, alkenyl group, alkoxy group, cycloalkyl group, or aryl group, each of which has 1–12 carbon atoms and may have a substituent, $R^1$ and $R^2$ may be bonded together to form a ring structure; $R^3$ and $R^4$ may be bonded together to form a ring structure; $R^5$–$R^{10}$ each independently represents an alkyl group which has 1–12 carbon atoms and may have a substituent; $R^{11}$–$R^{13}$ each independently represents a hydrogen atom, a halogen atom, or an alkyl group which has 1–8 carbon atoms and which may have a substituent, and $R^{12}$ may be bonded to $R^{11}$ or $R^{13}$ to form a ring structure, and when m is greater than 2, a plurality of the $R^{12}$ may be bonded to each other to form a ring structure; $R^4$–$R^5$ each independently represents a hydrogen atom, a halogen atom, or an alkyl group which has 1–8 carbon atoms and may have a substituent, and $R^{14}$ may be bonded to $R^{15}$ to form a ring structure, and when m is greater than 2, a plurality of the $R^{14}$ may be bonded to each other to form a ring structure; m is an integer from 1 to 8; and $X^-$represents an anion.

The aforementioned compound has the property of generating heat upon absorbing light. Further, it has an absorbing band within the infrared ray range from 700 to 1200 nm, has good compatibility with the alkali aqueous solution soluble polymer compound, and is a basic dye and thus interacts with the polymer compound, thereby controlling the solubility of the polymer compound. As a result, such a compound can be preferably used in the present invention.

In accordance with the present invention, the solubility of the alkali aqueous solution soluble resin (A) can be lowered in the image portions by the interaction of the resin (A) with the component (B), so that discrimination in forming images is improved, and high-quality images can be obtained. Thus, it is not necessary to add a compound having a light absorbing band within the visible ray range (350–500 nm), such as an onium salt or a quinonediazide compound. As a result, the composition of the present invention can be used under a white lamp as well. That is, the composition is not limited to being handled under a yellow lamp, as are conventional compositions. Furthermore, heat is efficiently used for forming images and the development latitude is suprisingly improved because images can be formed without a thermal decomposition reaction of an onium salt, a quinonediazide compounds or the like being used.

The I/O value is a measure of hydrophilicity and hydrophobicity, which is described in "Organic Conceptual Views" (Yoshio Koda, published by Sankyo Shuppan, 1984). As the value is smaller, the hydrophobicity is greater. As the value is larger, the hydrophilicity is greater. Thus, when the difference in the I/O values of compounds is small, that is, when the ratio of the I/O values of the compounds approaches 1, both are sufficiently compatible with each other. When the difference is large, the compounds are insufficiently compatible with each other.

The I/O value of a copolymer is obtained by averaging the I values and the O values of the respective constituent units on the basis of their composition ratios. The I/O value of a blended polymer compound is obtained by weight-averaging of the I values and the O values of the respective polymer compounds.

The present inventors also found that when a compound represented by following general formula (D) is added to a positive photosensitive composition for use with an infrared laser, a material for a positive lithographic printing plate obtained therefrom is stable in the state before development, and thus, the present inventors arrived at the present invention.

Thus, in accordance with the second aspect, a positive photosensitive composition for use with an infrared laser comprises a compound absorbing light so as to generate heat; an alkali aqueous solution soluble resin having a phenolic hydroxide group; and a compound represented by the following general formula (D):

$$R^1CO—X—R^2 \qquad (D)$$

(in which X represents O, S or $NR^3$; $R^1$ represents an alkyl group or alkenyl group which has 6–32 carbon atoms; and $R^2$ and $R^3$ represent a hydrogen atom, or an alkyl group, alkenyl group or aryl group which has 1–18 carbon atoms).

The advantageous effect of the addition of the compound represented by the general formula (D) is remarkable when the alkali aqueous solution soluble resin having a phenolic hydroxide group and a copolymer containing, as a copolymerized component, 10 mole % or more of at least one compound selected from the following compounds (a), (b) and (c) are used together as a binder resin:

a monomer (a) having in one molecule thereof a sulfonamide group in which at least one hydrogen atom is bonded to the nitrogen atom;

a monomer (b) having in one molecule thereof an active imino group represented by the following formula:

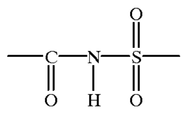

a compound (c) selected from the group consisting of acrylamide, methacrylamide, ester of acrylic acid, ester of methacrylic acid, and hydroxystyrene, each of which has a phenolic hydroxide group.

In the present invention, when the compound represented by above general formula (D) is included in the positive photosensitive composition for use with an infrared laser, a material for a positive lithographic printing plate obtained therefrom is stable in its state before development. The reason for this is unclear. However, in light of the fact that the static friction coefficient of the surface of the obtained positive lithographic printing plate material is lower than that of a positive lithographic printing plate material obtained from a composition which dose not include compound (D), it is assumed that, when the photosensitive composition of the present invention is applied to a substrate and dried, compound (D) rises up to the surface of the plate material and forms a film thereat, and this film functions as a protective film:

The present inventors already found that when the alkali aqueous solution soluble resin having a phenolic hydroxide group and the aforementioned copolymer are used together as a binder resin, the material absorbing light to generate heat concentrates in the resin surface layer of a lithographic printing plate, thereby improving development latitude (Japanese Patent Application No. 9-217176). In this case the effect of the addition of the compound represented by the aforementioned general formula (D) is assumed to be exhibited so remarkably, because the state of the surface before the development of the lithographic printing plate material significantly influences developability.

In short, the present invention provides a positive photosensitive composition for use with an infrared laser which is used in "computer-to-plate" systems and is stable in its state before development and has an excellent handling property.

DESCRIPTION OF THE PREFERRED EMBODIMENTS

First, a first embodiment of the present invention will be described in detail hereinafter.

The alkali aqueous solution soluble polymer compound (A) used in the present embodiment is a polymer compound having in the molecule any one of a phenolic hydroxide group (a-1), a sulfonamide group (a-2), and an active imide (a-3). However, there may also be preferably used both an alkali aqueous solution soluble resin having a phenolic hydroxide group (a-1), and a copolymerized compound containing, as a copolymerized component, 10 mole % or more of at least one functional group selected from the aforementioned (a-1), (a-2) and (a-3) The alkali aqueous solution soluble resin having a phenolic hydroxide group (a-1) will be hereinafter referred to as "the resin having a phenolic hydroxide group", and the copolymerized compound will be hereinafter referred to as "the specific compound".

The polymer compound having the phenolic hydroxide group (a-1) may be, for example, a Novolak resin such as phenol formaldehyde resin, m-cresol formaldehyde resin, p-cresol formaldehyde resin, m-/p-mixed cresol formaldehyde resin, phenol/cresol (any one of m-, p-, and mixed m-/p-) mixed formaldehyde resin, or may be pyrogallol acetone resin.

The resin having a phenolic hydroxide group preferably has a weight-average molecular weight of from 500 to 20000, and a number-average molecular weight of from 200 to 10000.

As described in the specification of U.S. Pat. No. 4,123,279, at the same time there may be used a condensed compound of formaldehyde and phenol resin having, as a substituent, an alkyl group having 3–8 carbon atoms, such as t-butylphenol formaldehyde resin or octylphenol formaldehyde resin. A single resin having a phenolic hydroxide group may be used alone, or two or more resins having a phenolic hydroxide group may be used together.

In regard to the alkali aqueous solution soluble polymer compound having a sulfonamide group (a-2), the monomer having the sulfonamide group (a-2), which is the monomer mainly forming this polymer compound, may be a monomer of a low molecular weight compound having in the molecule one or more sulfonamide groups in which at least one hydrogen atom is bonded to the nitrogen atom, and one or more unsaturated bonds which can be polymerized. Among these, preferred is a low molecular weight compound having an acryloyl group, allyl group or vinyloxy group, and a substituted or mono-substituted aminosulfonyl group or substituted sulfonylimino group.

Examples of such a compound include compounds represented by the following general formulae (II)–(VI):

General Formula (II)

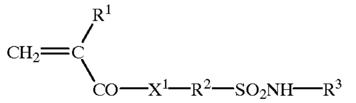

General Formula (III)

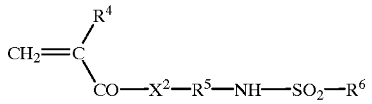

General Formula (IV)

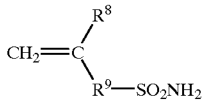

General Formula (V)

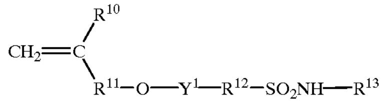

General Formula (VI)

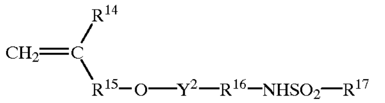

in which $X^1$ and $X^2$ each independently represents —O— or —$NR^7$—; $R^1$ and $R^4$ each independently represents a hydrogen atom or —$CH_3$; $R^2$, $R^5$, $R^9$, $R^{12}$ and $R^{16}$ each independently represents an alkylene group, cycloalkylene group, arylene group or aralkylene group, each of which has 1–12 carbon atoms and may have a substituent; $R^3$, $R^7$ and $R^{13}$ each independently represents a hydrogen atom, or an alkyl group, cycloalkyl group, aryl group or aralkyl group, each of which has 1–12 carbon atoms and may have a substituent; $R^6$ and $R^{17}$ each independently represents an alkyl group, cycloalkyl group, aryl group or aralkyl group, each of which has 1–12 carbon atoms and may have a substituent; $R^8$, $R^{10}$ and $R^{14}$ represent a hydrogen atom or —$CH_3$; $R^{11}$ and $R^{15}$ each independently represents an alkylene group, cycloalkylene group, arylene group or aralkylene group, each of which has 1–12 carbon atoms and may have a single bond or a substituent; and $Y^1$and $Y^2$ each independently represents a single bond or —co—.

Specifically, there may be preferably used m-aminosulfonylphenyl methacrylate, N-(p-aminosulfonylphenyl)methacrylamide, N-(p-aminosulfonylphenyl)acrylamide, or the like.

The alkali aqueous solution soluble polymer compound having an active imide group (a-3) is a compound having in the molecule an active imide group represented by the following formula 4. The monomer having the active imide group (a-3), which monomer mainly forms this polymer compound, may be a low molecular weight compound having in one molecule one or more active imino groups represented by the following formula 4 and one or more unsaturated bonds which can be polymerized.

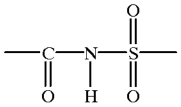

As such a compound, specifically N-(p-toluenesulfonyl) methacrylamide or N-(p-toluenesulfonyl)acrylamide or the like can be preferably used.

As the alkali aqueous solution soluble polymer compound (A) in the present embodiment, there may be used not only a polymer compound having, as the main structural unit, a monomer containing any of the functional groups selected from (a-1) to (a-3), and mixtures of such compounds, but also, as described above, a resin having the phenolic hydroxide group (a-1), and a compolymerized compound containing, as a copolymerized component, 10 mole % or more of at least one functional group selected from above (a-1) through (a-3). This copolymer will be described hereinafter.

The polymer compound having the phenolic hydroxide group (a-1) may be, for example, phenol formaldehyde resin, m-cresol formaldehyde resin, or the like. A different monomer having the phenolic hydroxide group (a-1) can be copolymerized with this polymer compound. This different monomer which serves as a copolymerizable monomer may be acrylamide, methacrylamide, acrylic ester, methacrylic ester or a hydroxystyrene monomer, each of which has a phenolic hydroxide group.

Specific, preferred examples of such a compound which can be used include N-(4-hydroxyphenyl)acrylamide, N-(4-hydroxyphenyl)methacrylamide, o-hydroxyphenylacrylate, m-hydroxyphenylacrylate, p-hydroxyphenylacrylate, o-hydroxyphenylmethacrylate, m-hydroxyphenylmethacrylate, p-hydroxyphenylmethacrylate, o-hydroxystyrene, m-hydroxystyrene, p-hydroxystyrene, and the like.

Similarly, a monomer having the sulfonamide group (a-2) or a monomer having the active imide group (a-3) can be used as the copolymerized-component.

The alkali aqueous solution soluble copolymer used in the present embodiment contains as a copolymerized component preferably 10 mole % or more, and more preferably 20 mole % or more, of at least one of the functional groups selected from (a-1) to (a-3). If the amount of the copolymerized component is less than 10 mole %, the interaction between the copolymerized compound and the resin having a phenolic hydroxide group is insufficient, and thus the improvement in development latitude, which is an advantage resulting from use of the copolymerized component, is insufficient.

The copolymer may contain copolymerized components other than (a-1), (a-2) and (a-3).

Examples of other copolymerized components which may be used are the monomers listed in following (1)–(12):

(1) acrylic esters and methacrylic esters having an aliphatic hydroxyl group such as 2-hydroxyethylmethacrylate or 2-hydroxyethymethacrylate, (2) alkylacrylates such as methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate, and N-dimethylaminoethyl acrylate, (3) alkylmethacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate, and N-dimethylaminoethyl methacrylate, (4) acrylamides or methacrylamides such as acrylamide, methacrylamide, N-methylolacrylamide N-ethylacrylamide, N-hexylmethacrylamide, N-cyclohexylacrylamide, N-hydroxyethylacrylamide, N-phenylacrylamide, N-nitrophenylacrylamide, N-ethyl-N-phenylacrylamide, (5) vinyl ethers such as ethylvinyl ether, 2-chloroethylvinyl ether, hydroxyethylvinyl ether, propylvinyl ether, butylvinyl ether, octylvinyl ether, and phenylvinyl ether, (6) vinyl esters such as vinyl acetate, vinyl chloroacetate, vinyl butyrate, and vinyl benzoate, (7) styrenes such as styrene, α-methylstyrene, methylstyrene, and chloromethylstyrene, (8) vinyl ketones such as methylvinyl ketone, ethylvinyl ketone, propylvinyl ketone, and phenylvinyl ketone, (9) olefins such as ethylene, propylene, isobutylene, butadiene, and isoprene,

(10) N-vinylpyrrolidone, N-vinylcarbazole, 4-vinylpyridine, acrylonitrile, and methacrylonitrile,

(11) unsaturated imides such as maleimide, N-acryloylacrylamide, N-acetylmethacrylamide, n-propionylmethacrylamide and n-(p-chlorobenzoyl) methacrylamide, and

(12) unsaturated carboxylic acids such as acrylic acid, methacrylic acid, maleic anhydride, and itaconic acid.

The alkali aqueous solution soluble polymer compound (A) in the present embodiment, whether it is a homopolymer or a copolymer, preferably has a weight-average molecular weight of 2000 or more, and a number-average molecular weight of 500 or more, and more preferably has a weight-average molecular weight of from 5000 to 300000, a number-average molecular weight of from 800 to 250000, and a dispersion degree (weight-average molecular weight/number-average molecular weight) of from 1.1 to 10.

In the case in which the resin having the phenolic hydroxide group (a-1) and the aforementioned specific copolymer component form a copolymer, the ratio of the former to the latter is preferably from 50:50 to 5:95, and more preferably from 40:60 to 10:90.

The alkali aqueous solution soluble polymer compound (A) may be used alone or two or more types may be used in combination. The amount thereof is from 30 to 99 weight %, preferably from 40 to 95 weight %, and especially preferably from 50 to 90 weight % of the entire content of solids in the printing plate material. If the added amount of the alkali aqueous solution soluble polymer compound is less than 30 weight %, the durability of the recording layer deteriorates. If the added amount is more than 99% by weight, both the sensitivity and durability deteriorate.

As described above, compound (B) has an I/O value (Y), whose relationship with the I/O value (X) of the alkali aqueous solution soluble polymer compound (A) satisfies the above inequality (1) and compound (B) is compatible with the alkali aqueous solution soluble polymer compound, thereby lowering the solubility of the alkali aqueous solution soluble polymer compound. This effect of lowering the solubility is reduced by heating.

In other words, compound (B) must be a compound that has good compatibility with the alkali aqueous solution soluble polymer compound (A) so that the compounds can form a uniform liquid when mixed together. In addition, compound (B) must be able to reduce the solubility of compound (A) in an alkali aqueous solution by interacting with the component (A) in the recording layer made from an applying solution in which compound (A) is uniformly mixed with compound (B). Such interaction between compounds (A) and (B) is carried out by the functional groups in a molecule of compound (B) such as groups having a hydrogen bonding ability. As described above, however, in a case in which the component (B) itself is a compound which is decomposed by heating, the effect of suppressing the solubility may be insufficiently reduced and the sensitivity and the development latitude may decrease if energy sufficient for decomposition is not applied to this compound due to conditions such as laser output, laser-radiating time, and the like. Therefore, the photosensitive composition of the present embodiment should not contain any compound having a thermal decomposition temperature of 150° C. or less.

The relationship between the I/O value (Y) of the component (B) and the I/O value (X) of the component (A) satisfies the aforementioned inequality (1). That is, the absolute value of the difference between X and Y must be within the range from 0.05 to 0.5. If this absolute value of the difference between the I/O values is more than 0.5, the compatibility of both of the components with each other deteriorates, making it difficult for a uniform recording layer to be formed. If the absolute value is less than 0.05, the solubility of the heated component (A) in an alkali aqueous solution is not satisfactorily exhibited, thereby reducing the development latitude low. Both of these cases are thus not preferred. When two or more types of components (A) are used together, the weight averages of the I values and the 0 values of the components (A) are obtained, respectively, in the light of the amounts of the contained components, and then a general I/O value is calculated, as the I/O value of all the components (A), from these weight-averages of the I values and O values. When a plurality of components (B) are used together, the I/O value is obtained in the same manner.

The component (B) which is preferably used in the present embodiment is any compound which interacts with the component (A), such as sulfone compounds, ammonium salts, phosphonium salts and amide compounds.

The component (B) should be appropriately selected in the light of the I/O value of the component (A), as described above. Specifically, cyanine dyes A (I/O value: 0.84), examples of which are given below, are suitably used in the case of using Novolak resin (I/O value:0.71) alone as the component (A).

In general, the composition (mixing) ratio of the component (A) to the component (B) is preferably from 99/1 to 75/25. If the amount of component (B) is lower than this lowest limit, the component (B) dose not interact sufficiently with the component (A), and thus the solubility of the component (A) in an alkali aqueous solution is not impeded and it is difficult to obtain good images. If the amount of component (B) is more than the aforementioned upper limit, the interaction is excessive so that sensitivity is remarkably reduced. Thus, both cases are not preferred.

In the present embodiment, the compound (C) which absorbs light and generates heat is a compound that has a light absorption band within the infrared range of 700 nm or more, preferably from 750 to 1200 nm, and exhibits light/heat converting effect for light having a wavelength within this range. Component (C) specifically may be any of various pigments or dyes which absorb light having a wavelength within this range to generate heat.

The pigments which can be used may be commercially available pigments and pigments described in the Color Index (C. I.) Handbook, "Latest Pigment Handbook" (edited by the Japan Pigment Technical Association, published in 1977), "Latest Pigment Applied Technology" (CMC Publications, published in 1986) and "Printing Ink Technology" (CMC Publications, published in 1984).

The types of pigments which can be used are black pigments, yellow pigments, orange pigments, brown pigments, red pigments, violet pigments, blue pigments, green pigments, fluorescent pigments, metallic powdery pigments, or polymer-bonded colorants. Specific Examples are insoluble azo pigments, azo lake pigments, condensed azo pigments, chelate azo pigments, phthalocyanine-based pigments, anthraquinone-based pigments, perylene or perynone-based pigments, thioindigo-based pigments, quinacridone-based pigments, dioxazine-based pigmensts, isoindolinone-based pigments, quinophthalone-based pigments, vat dyeing lake pigments, azine pigments, nitroso pigments, nitro pigments, natural pigments, fluorescent pigments, inorganic pigments and carbon black.

These pigments may be used with or without being subjected to surface treatment. Methods for surface treatment include methods of applying a surface coat of resin or wax, methods of applying surfactant, and methods of bonding a reactive material (for example, a silane coupling agent, an epoxy compound, polyisocyanate, or the like) to the surface of the pigment. These methods for surface treatment are described in "Properties and Application of Metallic Soap" (published by Saiwai Shobo), "Printing Ink Technology" (CMC Publications, published in 1984) and "Latest Pigment Applied Technology" (CMC Publications, published in 1986).

The particle size of the pigment is preferably from 0.01 to 10 $\mu$m, more preferably from 0.05 to 1 $\mu$m and especially preferably from 0.1 to 1 $\mu$m. A particle size of the pigment of less than 0.01 $\mu$m is not preferred from the standpoint of the stability of the dispersed pigment in a photosensitive layer coating liquid. A particle size of more than 10 $\mu$m is not preferred from the standpoint of uniformity of the formed photosensitive layer.

The method for dispersing the pigment which can be used may be any known dispersion method which is used for the production of ink or toner or the like. Dispersing machines include an ultrasonic disperser, a sand mill, anattritor, a pearl mill, a super mill, a ball mill, an impeller, a disperser, a KD mill, a colloid mill, a dynatron, a three-roll mill and a press kneader. Details thereof are described in "Latest Pigment Applied Technology" (CMC Publications, published in 1986).

The dyes which can be used may be any known dyes, such as commercially available dyes or dyes described in, for example, "Dye Handbook" (edited by the Organic Synthetic Chemistry Association, published in 1970). Specific examples thereof include azo dyes, metal complex salt azo dyes, pyrazolone azo dyes, anthraquinone dyes, phthalocyanine dyes, carbonium dyes, quinonimine dyes, methine dyes, cyanine dyes, and the like.

In the present embodiment, among these pigments and dyes, those which absorb infrared or near infrared rays are especially preferred because of their suitability for use with lasers emitting infrared or near infrared rays.

Carbon black can be suitably used as the pigment which absorbs infrared or near infrared rays. Dyes which absorb infrared or near infrared rays are, for example, cyanine dyes disclosed in Japanese Patent Application Laid-Open (JP-A) Nos. 58-125246, 59-84356, 59-202829, and 60-78787; methine dyes disclosed in JP-A Nos. 58-173696, 58-181690, and 58-194595; naphthoquinone dyes disclosed in JP-A Nos. 58-112793, 58-224793, 59-48187, 59-73996, 60-52940 and 60-63744; squarylium colorant disclosed in JP-A No. 58-112792; and cyanine dyes disclosed in British Patent No. 434,875.

Examples of dyes which can be suitably used are the near infrared ray-absorbing sensitizers disclosed in U.S. Pat. No. 5,156,938. Examples of dyes which are especially preferably used are substituted arylbenzo(thio)pyrylium salts described in U.S. Pat. No. 3,881,924; trimethinethia pyrylium salts described in JP-A No. 57-142645 (U.S. Pat. No. 4,327,169); pyrylium-based compounds described in JP-A Nos. 58-181051, 58-220143, 59-41363, 59-84248, 59-84249, 59-146063, and 59-146061; cyanine colorant described in JP-A No. 59-216146; pentamethinethiopyrylium salts described in U.S. Pat. No. 4,283,475; and pyrylium compounds, Epolight III-178, Epolight III-130 and Epolight III-125 described in Japanese Patent Application Publication (JP-B) Nos. 5-13514 and 5-19702.

Another example of especially preferred dyes is the near infrared ray-absorbing dyes represented by formulas (I) and (II) in U.S. Pat. No. 4,756,993.

The pigments or dyes may be added into the material for a printing plate in an amount of from 0.01 to 50 weight %, preferably from 0.1 to 10 weight %, and especially preferably from 0.5 to 10 weight % (in the case of the dye) and from 3.1 to 10 weight % (in the case of the pigment), with respect to the entire amount of solids in the material for the printing plate. If the pigment or dye content is less than 0.01 weight %, sensitibity is lowered. If this content is more than 50 weight %, uniformity of the photosensitive layer is lost and durability of the recording layer deteriorates.

These dyes or pigments may be added into the same layer as the other components, or may be added in a different layer. In the case of using a different layer, the different layer is preferably a layer adjacent to the layer containing the compound of the present embodiment which is thermally decomposable and which substantially lawers the solubility of the binder when the compound is not in a decomposed state. These dyes or pigments and the binder resin are preferably contained in the same layer, but may be contained in different layers.

Compound (B) has an I/O value (Y), whose relationship with the I/O value (X) of the alkali aqueous solution soluble polymer compound satisfies the above inequality (1), and compound (B) is compatible with the alkali aqueous solution soluble polymer compound, thereby lowering the solubility of the alkali aqueous solution soluble polymer compound. This effect of lowering the solubility is reduced by heating. Compound (C) absorbs light so as to generate heat. However, in place of using compound (B) and compound (C), the composition of the present embodiment can contain a compound having the characteristics of both compound (B) and compound (C). (This compound having the characteristics of both compounds will occasionally be referred to hereinafter as component (B+C).) An example of this compound is the compound represented by above general formula (I).

The aforementioned compound (the component (B+C)) has the property of absorbing light so as to generate heat (that is, has the characteristic of the component (C)). Further, component (B+C) has an absorbing band within the infrared range from 700 to 1200 nm, has the I/O value (Y) whose relationship with the I/O value (X) of the alkali aqueous solution soluble polymer compound satisfies the aforementioned inequality (1) so as to be well compatible with the component (A), is a basic dye, and has in the molecule a group interacting with the alkali aqueous solution soluble polymer compound, such as an ammonium group or iminium group, (that is, has the characteristics of the component (B)) so as to interact with the alkali aqueous solution soluble polymer compound. Thus, the component (B+C) can control the solubility of the component (A) in an alkali aqueous solution, and can be suitably used in the present embodiment.

In the general formula (I), $R^1$–$R^4$ each independently represents a hydrogen atom, or an alkyl group, alkenyl group, alkoxy group, cycloalkyl group , or aryl group, each of which has 1–12 carbon atoms and may have a substituent. $R^1$ and $R^2$ may be bonded together to form a ring structure; $R^3$ and $R^4$ may be bonded together to form a ring structure. Specific examples of $R^1$–$R^4$ include a hydrogen atom, methyl group, ethyl group, phenyl group, dodecyl group, naphthyl group, vinyl group, allyl group and cyclohexyl group or the like. When these groups have a substituent, the substituent may be a halogen atom, carbonyl group, nitrogroup, nitryl group, sulfonyl group, carboxyl group, carboxylic ester, sulfonic ester, or the like.

$R^5$–$R^{10}$ each independently represents an alkyl group which has 1–12 carbon atoms and may have a substituent, and specifically may be methyl group, ethyl group, phenyl group, dodecyl group, naphthyl group, vinyl group, allyl group, cyclohexyl group, or the like. When these groups have a substituent, the substituent may be a halogen atom, carbonyl group, nitro group, nitryl group, sulfonylgroup , carboxyl group, carboxylic ester, sulfonic ester, or the like.

$R^{11}$–$R^{13}$ each independently represents a hydrogen atom, a halogen atom, or an alkyl group which has 1–8 carbon atoms and may have a substituent. $R^{12}$may be bonded to $R^{11}$ or $R^{13}$ to form a ring structure. When m is greater than 2, a plurality of the $R^{12}$ may be bonded to each other to form a ring structure. Specific examples of $R^{11}$–$R^{13}$include a chlorine atom, a cyclohexyl group, a cyclopentyl ring or a cyclohexyl ring and the like composed of plural $R^{12}$ bonded to each other. When these groups have a sub-stituent, the substituent may be a halogen atom, carbonyl group, nitro group, nitryl group, sulfonyl group, carboxyl group, carboxylic ester, sulfonic ester or the like. Further, m is an integer from 1 to 8, and preferably from 1 to 3.

$R^{14}$–$R^{15}$ each independently represents a hydrogen atom, a halogen atom, or an alkyl group which has 1–8 carbon atoms and may have a substituent. $R^{14}$ may be bonded to $R^{15}$ to form a ring structure. When m is greater than 2, a plurality of the $R^{14}$ may be bonded to each other to a ring structure. Specific examples of $R^{14}$ and $R^{15}$ are a chlorine atom, a cyclohexyl group, a cyclopentyl ring or a cyclohexyl ring and the like composed of plural $R^{14}$ bonded to each other, a cyclohexyl ring, and the like. When these groups have a substituent, the substituent may be a halogen atom, carbonyl group, nitro group, nitryl group, sulfonyl group, carboxyl group, carboxylic ester, sulfonic ester, or the like. Further, m is an integer from 1 to 8, and preferably from 1 to 3.

In the general formula (I), specific examples of the anion represented by X include perchloric acid, tetrafluoro boric acid, hexafluoro phosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenezenesulfonic acid, 1-naphthol-5-sulfonic acid, 2-methoxy-4-hydroxy-5-benzoyl-benzenesulfonic acid, paratoluenesulfonic acid, and the like. Among these, especially preferred are hexafluoro phosphoric acid, triisopropylnaphthalenesulfonic acid, and alkylaromatic sulfonic acids such as 2,5-dimethylbenzenesulfonic acid.

The compounds represented by the general formula (I) are compounds generally called cyanine dyes. Specific examples of the compounds which can be preferably used are represented by the following formulas. However, the compounds are not limited to these specific examples.

cyanine dye A

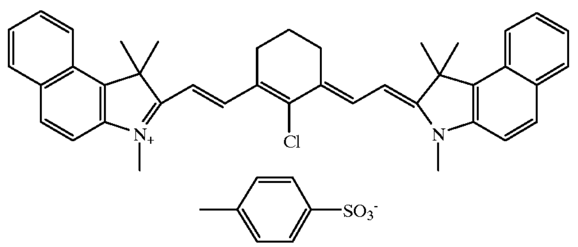

cyanine dye B

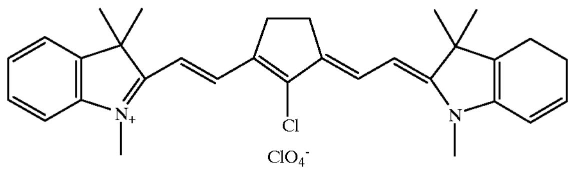

cyanine dye C

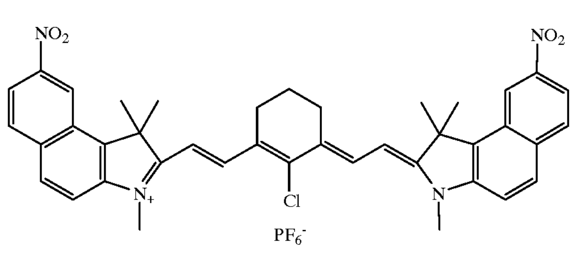

-continued cyanine dye D

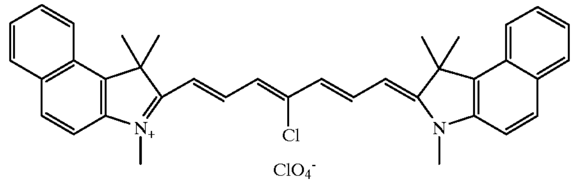

cyanine dye E

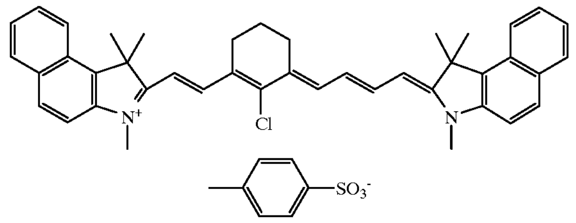

In the present embodiment, when the compound (component (B+C)) having the characteristics of both component (B) and component (C), e.g., the aforementioned cyanine dye, is used instead of the components (B) and (C), the ratio of this compound to be added to the (A) compound is preferably from 99/1 to 70/30, and more preferably from 99/1 to 75/25, from the standpoint of sensitivity.

Various additives may be optionally added to the positive photosensitive composition of the present embodiment. For example, phenolic compounds and organic acids may be used together to improve the sensitivity. Examples of the phenolic compounds include bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, 4,4',3,4"-tetrahydroxy-3,5,3',5'-tetramethyltriphenylmethane and the like. Examples of the organic acids are those described in JP-A Nos. 60-88942 and 2-96755, i.e., sulfonic acids, sulfinic acids, alkylsulfuric acids, phosphonic acids, phosphoric esters and carboxylic acids, and specifically, p-toluenesulfonic acid, dodecylbenzenesulfonic acid, p-toluenesulfinic acid, ethylsulfuric acid, phenyl phosphonic acid, phenyl phosphinic acid, phenyl phosphate, diphenyl phosphate, benzoic acid, isophthalic acid, adipic acid, p-toluyl acid, 3,4-dimethoxybenzoic acid, phthalic acid, terephthalic acid, 4-cyclohexene-1,2-dicarboxylic acid, erucic acid, lauric acid, n-undecanic acid, and ascorbic acid.

The amount of the phenolic compound or the organic acid in the material for the printing plate is preferably from 0.05 to 20 weight %, more preferably from 0.1 to 15 weight %, and especially preferably from 0.1 to 10 weight %.

In order to achieve stability in processing in a broader range of processing conditions, it is possible to add, to the material for the printing plate according to the present embodiment, a nonionic surfactant as described in JP-A Nos. 62-251740 and 3-208514 or an amphoteric surfactant as described in JP-A Nos. 59-121044 and 4-13149.

Specific examples of the nonionic surfactant include sorbitan tristearate, sorbitan monopalmitate, sorbitan trioleate, monoglyceride stearate, and polyoxyethylenenonylphenylether or the like.

Specific examples of the amphoteric surfactant include alkyldi(aminoethyl)glycine, alkylpolyaminoethylglycine hydrochloride, 2-alkyl-N-carboxyethyl-N-hydroxyethylimidazolium betaine, N-tetradecyl-N,N-betaine (e.g., trade name Amogen, manufactured by Dai-ichi Kogyo Co., Ltd.), and the like. The amount of the nonionic or amphoteric surfactant is preferably from 0. 05 to 15 weight percent and more preferably from 0.1 to 5 weight % of the material for the printing plate.

A printout agent for obtaining a visible image immediately after heating caused by exposure, or a dye or pigment as an image colorant, may be added to the material for a printing plate of the present embodiment.

A representative example of the printout agent is a combination of a compound which releases an acid by heating due to exposure, and an organic dye which can form a salt with the acid releasing compound. Specific examples of such a combination are the combinations of o-naphthoquinonediazide-4-sulfonic halogenide anda salt-forming organic dye as described in JP-A Nos. 50-36209 and 53-8128, and the combinations of a trihalomethyl compound and a salt-forming organic dye described in JP-A Nos. 53-36223, 54-74728, 60-3626, 61-143748, 61-151644 and 63-58440. Trihalomethyl compounds are classified into oxazole-based compounds and triazine-based compounds, and both have excellent stability over time to produce clear printout images.

As the image colorant, dyes other than the aforementioned salt forming organic dyes may be used. Examples of preferred dyes, including the salt forming organic dyes, are oil-soluble dyes and basic dyes. Specific examples are Oil-Yellow #101, Oil Yellow #103, Oil Pink #312, Oil Green BG, Oil Blue BOS, Oil Blue #603, Oil Black BY, Oil Black BS, Oil Black T-505(all of which are manufactured by Orient Chemical Industries Co,. Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015), or the like. The dyes described in JP-A No. 62-293247 are especially preferred. The dye may be added into the material for the printing plate in an amount of preferably from 0.01 to 10 weight % and more preferably from 0.1 to 3 weight % of the entire solid contents of the material for the printing plate. A plasticizer for providing the formed film with softness may be added as needed in the material for the printing plate in the present embodiment. The plasticizer may be butylphthalyl, polyethyleneglycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, an oligomer or polymer of acrylic acid or methacrylic acid, or the like.

Esters or amides of long chain fatty acids may be added to improve the strength of the formed film.

The image recording material according to the present embodiment can be produced by dissolving the aforementioned respective components into a solvent and then applying the solution onto an appropriate substrate. The solvent used herein may be ethylenedichloride, cyclohexanone, methylethyl ketone, methanol, ethanol, propanol, ethyleneglycolmonomethylether, 1-methoxy-2-propanol, 2-methoxyethyl acetate, 1-methoxy-2-propyl acetate, dimethoxyethane, methyl lactate, ethyl lactate, N,N-dimethylacetoamide, N,N-dimethylformamide, tetramethylurea, N-methylpyrrolidone, dimethylsulfoxide, sulfolane, γ-butyrolactone, and toluene or the like. However, the solvent is not limited to these examples. A single solvent may be used alone, or a combination of two or more solvents may be used. The concentration of the aforementioned components (all of the solid components including the additives) in the solvent is preferably from 1 to 50 weight %. The applied amount (of the solid) on the substrate obtained after application and drying differs in accordance with the use, but in general, is preferably from 0.5 to 5.0 $g/m^2$ for a photosensitive printing plate. The method for applying the solution may be any of various methods, for example, bar coater coating, rotating coating, spray coating, curtain coating, dip coating, air knife coating, blade coating, and roll coating, or the like. The less the amount applied to the substrate, the higher the apparent sensitivity, but the worse the film characteristics of the photosensitive film.

A surfactant for improving the applying property, for example, any of the fluorine-containing surfactants described in JP-A No. 62-170950, may be added into the photosensitive layer in the present embodiment. The amount of the surfactant added is preferably from 0.01 to 1 weight % and more preferably from 0.05 to 0.5 weight % of the entire material for the printing plate.

The substrate which is used in the present embodiment is a plate-like object having stable dimensions (i.e., having little undesirable expansion, etc.), and may be, for example, paper; paper on which plastic such as polyethylene, polypropylene, polystyrene or the like is laminated; a metal plate such as an aluminum, zinc or copper plate; a plastic film formed of, for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, or polyvinyl acetal; a paper or a plastic film on which the aforementioned metal is vapor-deposited or laminated; or the like.

As the substrate in the present embodiment, a polyester film or an aluminum plate is preferred, and an aluminum plate is especially preferred because of its stable dimensions and relatively low cost. A preferable aluminum plate is a pure aluminum plate or is an alloy plate comprising aluminum as the main component and a very small amount of different elements. A plastic film on which aluminum is laminated or vapor-deposited may be used. Examples of different element which may be contained in the aluminum alloy are silicon, iron, manganese, copper, magnesium, chromium, zinc, bismuth, nickel, titanium and the like. The content of the different element in the alloy should be 10 weight % or less. An especially preferable aluminum. in the present invention is pure aluminum. However, from the standpoint of refining techniques, it is difficult to prepare a completely pure aluminum. Therefore, an aluminum containing a very small amount of different elements may be used. The composition of the aluminum plate applied to the present invention is not specified, and the aluminum plate may be any conventionally known aluminum plate. The thickness of the aluminum plate used in the present embodiment is from about 0.1 to 0.6 mm, preferably from 0.15 to 0.4 mm, and especially preferably from 0.2 to 0.3 mm.

Before making the surface of the aluminum plate rough, if desired, the surface may be subjected to a degreasing treatment with, for example, a surfactant, organic solvent or alkali aqueous solution, to remove rolling oil from the surface.

The treatment for roughening the surface of the aluminum plate may be carried out in any of various ways such as, for example, a method of mechanically roughening the surface, a method of electrochemically melting the surface and making it rough, and a method of chemically and selectively melting the surface. The mechanical method may be any known method such as ball polishing, brushpolishing, blast polishing, buff polishing, or the like. The electrochemical method of making the surface rough may be a method of applying alternate or direct current to the surface in an electrolytic solution of hydrochloric acid or nitric acid. A combination of both mechanical and electrochemical methods may be used, as disclosed in JP-A No. 54-63902.

The aluminum plate whose surface has been roughened as described above is optionally subjected to an alkali etching treatment and a neutralizing treatment, and then, if desired, is subjected to anodic oxidization treatment for improving the water holding property and wear resistance of the surface. The electrolyte which is used in the anodic oxidization treatment of the aluminum plate may be any of various electrolytes which can form a porous oxidized film, and in general, sulfuric acid, phosphoric acid, oxalic acid, chromic acid, or mixtures thereof may be used. The concentration of the electrolyte is determined appropriately in accordance with the type of electrolyte.

The anodic oxidization treatment conditions cannot be specified because they vary in accordance with the type of electrolyte. In general, however, it is appropriate for the concentration of the electrolyte in the solution to be from 1 to 80 weight %, the temperature of the solution to be from 5 to 70° C. the current density to be 5 to 60 $A/dm^2$, the voltage to be from 1 to 100 V, and the time for the electrolysis to be from 10 seconds to 5 minutes.

If the amount of the anodically oxidized film is less than 1. 0 $g/m^2$, the wear resistance of the plate is insufficient, or it is easy for scratches to be formed at the non-image portions on the lithographic printing plate, such that it is easy for so-called "scratch stains" to be formed, i.e., ink adhering to the scratches at the time of printing.

After being subjected to the anodic oxidization treatment, the surface of the aluminum is optionally subjected to a hydrophilization treatment. The hydrophilization treatment which is used in the present invention may be an alkali metal silicate (e.g., an aqueous solution of sodium silicate) process as disclosed in U.S. Pat. Nos. 2,714,066, 3,181,461, 3,280,734 and 3,902,734. In this process, the substrate is dipped or electrolyzed in an aqueous solution of sodium silicate. Or, it is possible to use the process of treating the surface with potassium fluorozirconate as described in JP-B No. 36-22063, or with polyvinylphosphonic acid as disclosed in U.S. Pat. Nos. 3,276,868, 4,153,461, and 4,689,272.

The image recording material in the present embodiment is a material in which the positive material for a printing plate is disposed on a substrate. However, an undercoat layer may be provided between the substrate and the positive material as needed.

Various organic compounds may be used as the undercoat layer components, such as carboxymethylcellulose; dextrin; arabia rubber; phosphonic acids having an amino group such as 2-aminoethylphosphonic acid; organic phosphonic acids such as phenylphosphonic acid, naphthylphosphonic acid, alkylphosphonic acid, glycerophosphonic acid, methylenediphosphonic acid and ethylenediphosphonic acid, each of which may have a substituent; organic phosphoric acids such as phenylphosphoric acid, naphthylphosphoric acid, alkylphosphoric acid and glycerophosphoric acid, each of which may have a substituent; organic phosphinic acids such as phenylphosphinic acid, naphthylphosphinic acid, alkylphosphinic acid and glycerophosphinic acid, each which may have a substituent; amino acids such as glycine and β-alanine; and a hydrochloride of an amine having a hydroxy group such as a hydrochloride of triethanol amine. A single organic compound may be used, or a combination of two or more may be used.

The organic undercoat layer can be formed by either of the following methods: a method of applying, to the aluminum plate, a solution in which the aforementioned organic compound is dissolved in water or in an organic solvent such as methanol, ethanol or methylethyl ketone, or a mixed solution thereof, and the applied solution is dried; or a method of dipping the aluminum plate into a solution in which the aforementioned organic compound is dissolved in water or in an organic solvent such as methanol, ethanol or methylethyl ketone, or a mixed solution thereof so as to cause the plate to absorb the aforementioned compound, and then the plate is washed with water and dried so as to form the organic undercoat layer. In the former method, a solution having a concentration of the aforementioned organic compound of from 0.005 to 10 weight % can be applied in any of various manners. In the latter method, the concentration of the organic compound is from 0.01 to 20 weight %, and preferably from 0.05 to 5 weight %, and the dipping temperature is from 20 to 90° C. and preferably from 25 to 50° C., and the dipping time is 0.1 seconds to 20 minutes, and preferably from 2 seconds to 1 minute. The value of the pH of the solution used herein can be adjusted within the range from 1 to 12 by using basic substances such as ammonia, triethylamine or potassium hydroxide, or acidic substances such as hydrochloric acid or phosphonic acid. A yellow dye may be added to the solution to improve color tone reproducibility of the image recording material.

The amount of the applied organic undercoat layer is suitably from 2 to 200 $mg/m^2$ and preferably from 5 to 100 $mg/m^2$ If this amount is less than 2 $mg/m^2$ or more than 200 $mg/m^2$, sufficient wear resistance of the plate cannot be obtained.

In the image forming material of the present embodiment, a protective layer may be optionally provided on the photosensitive layer. Components of the protective layer may be, for example, polyvinylalcohol, or a mat material which is used for usual photosensitive lithographic printing plates or the like.

The positive image recording material produced as described above is usually subjected to image-exposure and developing processings.

In the present embodiment, the light source for an active light beam which is used in the image-exposure is preferably a light source emitting light having a luminous wavelength of 700 nm or more, within the range from the near infrared wavelength region to the infrared wavelength region, and is especially preferably a solid state laser or a semiconductor laser.

The developing solution and replenishing solution for the image recording material of the present embodiment may be a conventionally known alkali aqueous solution such as, for example, solutions of inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide, and lithium hydroxide; and organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine.

The alkali agent may be used alone, or a combination of two or more may be used.

Among these, especially preferred developing solutions are aqueous solutions of silicates, such as sodium silicate and potassium silicate. This is because developability can be adjusted by changing the ratio of silicon dioxide ($SiO_2$) and alkali metal oxides $M_2O$ and/or the concentrations of silicon dioxide and the alkali metal oxides (silicon dioxide and alkali metal oxides are the main components of a silicate). For example, alkali metal salts of silicic acid as described in JP-A No. 54-62004 and JP-B No. 57-7427 are effectively used.

It is known that when development is carried out by using an automatic developing machine, an aqueous solution (a replenishing solution) having a higher basicity than that of the developing solution is added to the developing solution so that many PS plates can be processed without having to replace the developing solution in the developing tank for a long time. In the present embodiment, such a replenishing manner is preferably used. various surfactants or organic solvents may be optionally added to the developing solution and the replenishing solution to accelerate or control developability, to improve the dispersibility of development-scum, and to improve the affinity of image portions on the printing plate with ink. The surfactant is preferably an anionic, cationic, nonionic, or amphoteric surfactant. A reducing agent such as hydroquinone, resorcine, a sodium or potassium salt of an inorganic acid such as sulfurous acid or sulfurous hydracid; an organic carboxylic acid; an anti-foamer; or a hard-water softener may be added to the developing solution and the replenishing solution as needed.

The printing plate developed with the developing solution and the replenishing solution is post-processed with water; a rinsing solution containing, for example, a surfactant; and a desensitizing solution containing gum arabic or a starch derivative. Various combinations of these treatments can be used as the post-processing carried out when the image recording material of the present embodiment is used as a printing plate.

Recently, in the printing-plate manufacturing and printing industries, for the efficiency and standardization of plate-manufacturing work there have been widely used automatic developing machines for printing plates. The automatic developing machine in general comprises a developing section and a post-processing section, and specifically comprises a device for conveying a printing plate, tanks for various processings, and a spray device, in which various processing solutions pumped up by a pump are sprayed on an exposed printing plate from spray nozzles while the plate is fed horizontally, so as to develop the printing plate. Recently, there has also been known a method in which a printing plate is processed by being immersed and conveyed in tanks filled with processing solutions by means of guide rolls disposed in the solutions or the like. Such automatic processing may be carried out while replenishing solutions are being replenished into the respective processing solutions in accordance with the processed amount or the working time.

A so-called disposable processing method, in which processing is carried out with processing solutions which are virtually unused, can be used.

A case in which the image recording material according to the present embodiment is used as a photosensitive lithographic printing plate will now be described. In a case in which alithographic printing plate obtained by image-exposure, development, washing with water, and/or rinsing, and/or rubber-coating has unnecessary image portions (for example, traces of film edges of the original film or the like), such unnecessary image portions are removed. It is preferred that the removal is carried out by applying a removing solution such as that described in JP-B No. 2-13293 onto the unnecessary image portions, allowing the printing plate to stand for a given period, and then washing the printing plate with water. However, the method disclosed in JP-A No. 59-174842 may be used in which the unnecessary image portions are irradiated with an active light beam guided through an optical fiber, and the printing plate is developed thereafter.

The lithographic printing plate obtained as described above, which may be optionally coated with desensitizing rubber, is subjected to a printing process. If a lithographic printing plate with higher plate wear resistance is desired, the plate is subjected to a burning treatment.

In the case of burning the lithographic printing plate, it is preferable to treat the plate with a surface-adjusting liquid such as those disclosed in JP-B Nos. 61-2518 and 55-28062, and JP-A Nos. 62-31859 and 61-159655, before the burning treatment.

Examples of methods of treating the lithographic printing plate with a surface-adjusting liquid include a method of applying the surface-adjusting liquid onto the lithographic printing plate with a sponge or a absorbent cotton which has absorbed the surface-adjusting liquid, a method of immersing the printing plate into a vat filled with the surface-adjusting liquid to coat the plate with the liquid, and a method of applying the surface-adjusting liquid with an automatic coater. Better results can be obtained if the amount of the surface-adjusting liquid is made uniform over the entire surface with a squeegee or squeeze rollers.

It is appropriate that the amount of the applied surface-adjusting liquid is generally from 0.03 to 0.8 g/$m^2$ (dry weight).

The lithographic printing plate treated with the surface-adjusting liquid is dried and, if necessary, it is heated to high temperature with a burning processor, for example, a "BP-1300" burning processor sold by Fuji Photo Film Co., Ltd. The heating temperature and the heating time in this step are varied in accordance with the types of components forming the image, but are preferably from 180 to 300° C. and 1 to 20 minutes, respectively.

If necessary, the lithographic printing plate subjected to the burning treatment may further be subjected to conventional treatments such as washing with water and rubber-coating. However, if a surface-adjusting liquid containing a water-soluble polymer compound or the like is used, a desensitizing treatment such as rubber-coating can be omitted.

The lithographic printing plate obtained in the above manner is set in an offset printing machine or the like, and is used for printing a number of sheets.

Examples of the present embodiment will be described hereinafter, but the present invention is not limited to these examples.

SYNTHESIS OF COPOLYMER CONTAINING COMPONENT (A)

SYNTHESIS EXAMPLE 1 (COPOLYMER 1)

Into a 500 ml three-neck flask with a stirrer, a condenser and a dropping funnel, 31.0 g (0.36 mole) of methacrylic acid, 39.1 g (0.36 mole) of ethyl chloroformate, and 200 ml of acetonitrile were added, and then the mixture was stirred while being cooled with an ice bath. Through the dropping funnel, 36.4 g (0.36 mole) of triethylamine was added by drops into this mixture over about 1 hour. After this addition, the ice bath was removed, and then the mixture was stirred at room temperature for 30 minutes.

Into this reaction mixture, 51.7 g (0.30 mole) of p-aminobenzenesulfonamide was added, and then the mixture was stirred for 1 hour while being heated with an oil bath at 70° C. After the reaction was finished, this mixture was added to 1 liter of water while the water was stirred, and then the resultant mixture was stirred for 30 minutes. This mixture was filtered to remove the precipitate. The precipitate was mixed with 500 ml of water to obtain a slurry, and then the slurry was filtered. The obtained solid was dried to yield a white solid of N-(p-aminosulfonylphenyl) methacrylamide (yield: 46.9 g).

Into a 100 ml three-neck flask with a stirrer, a condenser and a dropping funnel were added 5.04 g (0.0210 mole) of N-(p-aminosulfonylphenyl)methacrylamide, 2.05 g (0.018 mole) of ethyl methacrylate, 1.11 g (0.021 mole) of acrylonitryle and 20 g of N,N-dimethylacetamide, and then the mixture was stirred while being heated at 65° C. in a hot water bath. Into this mixture, 0.15 g of "V-65" (manufactured by Wako Junyaku K. K.) was added, and then the mixture was stirred in a nitrogen gas flow for 2 hours while a temperature of 65 ° C. was maintained. Into this reaction mixture, a mixture of 5.04 of N-(p-aminosulfonylphenyl)methacrylamide, 2.05 g of ethyl methacrylate, 1.11 g of acrylo-nitryl, 20 g of N,N-dimethylacetamide, and 0.15 g of "V-65" was added dropwise through the dropping funnel over 2 hours. After the dropwise addition was finished, the resultant mixture was stirred at 65° C. for 2 hours. After the reaction was finished, 40 g of methanol was added into the mixture, and the mixture was cooled. The obtained mixture was added into 2 liters of water while the water was stirred, and then the resultant mixture was stirred for 30 minutes. Thereafter, the precipitates were removed by filtration, and then dried to obtain 15 g of a white solid. The weight-average molecular weight (polystyrene reference) of the resultant copolymer 1 was measured by gel permeation chromatography, and found to be 53,000.

SYNTHESIS EXAMPLE 2 (COPOLYMER 2)

In the same manner as in Synthesis Example 1, a polymerization reaction was carried out except that the 5.04 g (0.0210 mole) of N-(p-aminosulfonylphenyl) methacrylamide in Synthesis Example 1 was replaced with 3.72 g (0.0210 mole) of N-(p-hydroxyphenyl) methacrylamide, so as to obtain a copolymer 2 having a weight-average molecular weight (polystyrene reference) of 47,000.

SYNTHESIS EXAMPLE 3 (COPOLYMER 3)

Into a 20 ml three-neck flask with a stirrer, a condenser and a dropping funnel were added 4.61 g (0.0192 mole) of N-(p-aminosulfonylphenyl)methacrylamide, 2.94 g (0.0258 mole of ethyl methacrylate, 0.80 g (0.015 mole) of acrylonitrile and 20 g of N,N-dimethylacetamide, and then the mixture was stirred while being heated at 65° C. in a hot water bath. Into this mixture, 0.15 g of "V-65" (manufactured by Wako Junyaku K. K.) was added, and then the mixture was stirred in a nitrogen gas flow for 2 hours while a temperature of 65° C. was maintained. Into this reaction mixture, a mixture of 4.61 of N-(p-aminosulfonylphenyl)methacrylamide, 2.94 g of ethyl methacrylate, 0.8 g of acrylonitrile, 20 g of N,N-dimethylacetamide, and 0.15 g of "V-65" was added dropwise through the dropping funnel over 2 hours. After the addition was finished, the mixture was stirred at 65 ° C. for 2 hours. After the reaction was finished, 40 g of methanol was added into the mixture, and the mixture was cooled. The obtained mixture was added into 2 liters of water while the water was stirred, and then the resultant mixture was stirred for 30 minutes. Thereafter, the precipitate was removed by filtration, and then dried to obtain 15 g of a white solid. The weight-average molecular weight (polystyrene reference) of the resultant copolymer 3 was measured by gel permeation chromatography, and found to be 58,000.

[Production of Substrate]

An aluminum plate (material quality: 1050) having a thickness of 0.3 mm was washed with trichloroethylene to remove grease, and then the surface was made coarse with a nylon brush and a 400 mesh pumice-water suspension, and then sufficiently washed with water. This plate was dipped into a 25% sodium hydroxide aqueous solution at 45° C. for 9 seconds to be etched. After the plate was washed with water, it was dipped into 20% nitric acid for 20 seconds, and then washed with water. The etched amount of the coarse surface was about 3 $g/m^2$. By direct current-anodic oxidization at a current density of $15A/dm^2$ with use of 7% sulfuric acid as an electrolytic solution, a direct current anodically oxidized film of 3 $g/dm^2$ was formed on the plate. Thereafter, the plate was washed with water, and dried. Then, the following undercoat liquid was applied to the plate, and the applied film was dried at 90° C. for 1 minute. The amount of the applied film after drying was 10 $mg/m^2$.

| Undercoat liquid | |
|---|---|
| β-Alanine | 0.5 g |
| Methanol | 95 g |
| Water | 5 g |

EXAMPLE 1

A lithographic printing plate was obtained by applying the following photosensitive liquid 1 onto the obtained substrate such that the applied amount was 1.8 $g/m^2$.

| Photosensitive liquid 1 | |
|---|---|
| m,p-cresol novolak (m/p ratio = 6/4; weight-average molecular weight: 3500, non-reacted cresol was contained in an amount of 0.5% by weight) [component (A), I/O value = 0.72] | 1.0 g |
| cyanine dye A [component (B + C), I/O value: 0.84) | 0.2 g |
| dye prepared by replacing the counter anion of Victoria Pure Blue BOH with an anion of 1-naphthalenesulfonic acid | 0.02 g |
| fluorine-containing surfactant (Megafac F-177, manufactured by Dainippon Ink & Chemicals, Inc.) | 0.05 g |
| γ-butylactone | 3 g |
| methylethyl ketone | 8 g |
| 1-methoxy-2-propanol | 7 g |

EXAMPLE 2

A lithographic printing plate was obtained by applying the following photosensitive liquid 2 onto the obtained substrate such that the applied amount was 1.8 $g/m^2$.

| Photosensitive liquid 2 | |
|---|---|
| copolymer 1 [component (A), I/O value = 1.55] | 1.0 g |
| cyanine dye B [component (B + C), I/O value: 1.49] | 0.1 g |
| p-toluene sulfonic acid | 0.002 g |
| dye prepared by replacing the counter anion of Victoria Pure Blue BOH with an anion of 1-naphthalenesulfonic acid | 0.02 g |
| fluorine-containing surfactant (Megafac F-177, manufactured by Dainippon Ink & Chemicals, Inc.) | 0.05 g |
| γ-butylactone | 8 g |
| methylethyl ketone | 8 g |
| 1-methoxy-2-propanol | 4 g |

EXAMPLE 3

A lithographic printing plate was prepared by applying the following photosensitive liquid 3 onto the obtained substrate such that the applied amount was 1.8 $g/m^2$.

| Photosensitive liquid 3 | |
|---|---|
| copolymer 2 [component (A), I/O value 1.18] | 1.0 g |
| cyanine dye B [component (B + C), I/O value: 1.49] | 0.1 g |
| p-toluene sulfonic acid | 0.002 g |
| dye prepared by replacing the counter anion of Victoria Pure Blue BOH with an anion of 1-naphthalenesulfonic acid | 0.02 g |
| fluorine-containing surfactant (Megafac F-177, manufactured by Dainippon Inc & Chemicals, Inc.) | 0.05 g |
| y-butylactone | 8 g |
| methylethyl ketone | 8 g |
| 1-methoxy-2-propanol | 4 g |

EXAMPLE 4

A lithographic printing plate was obtained by applying the following photosensitive liquid 4 onto the obtained substrate such that the applied amount was 1.8 $g/m^2$.

| Photosensitive liquid 4 | |
|---|---|
| m,p-cresol novolak (m/p ratio = 6/4, weight-average molecular weight: 3500, non-reacted cresol was contained in an amount of 0.5% by weight) [component (A), I/O value = 0.72] | 0.3 g |
| copolymer 1 [component (A), I/O value: 1.55] | 0.7 g |
| cyanine dye A [component (B + C), I/O value: 0.84] | 0.1 g |
| p-toluene sulfonic acid | 0.002 g |
| dye prepared by replacing the counter anion of Victoria Pure Blue BOH with an anion of 1-naphthalenesulfonic acid | 0.02 g |
| fluorine-containing surfactant (Megafac F-177, manufactured by Dainippon Ink & Chemicals, Inc.) | 0.05 g |
| γ-butylactone | 8 g |
| methylethyl ketone | 8 g |
| 1-methoxy-2-propanol | 4 g |

EXAMPLE 5

A lithographic printing plate was obtained by applying the following photosensitive liquid 5 onto the obtained substrate such that the applied amount was 1.8 $g/m^2$.

| Photosensitive liquid 5 | |
|---|---|
| m,p-cresol novolak (m/p ratio = 6/4, weight-average molecular weight: 3500, non-reacted cresol was contained in an amount of 0.5% by weight) [component (A), I/O value = 0.72] | 0.3 g |
| copolymer 2 [component (A), I/O value: 1.18] | 0.7 g |
| cyanine dye A [component (B + C), I/O value: 0.84] | 0.1 g |
| p-toluene sulfonic acid | 0.003 g |
| dye prepared by replacing the counter anion of Victoria Pure Blue BOH with an anion of 1-naphthalenesulfonic acid | 0.02 g |
| fluorine-containing surfactant (Megafac F-177, manufactured by Dainippon Ink & Chemicals, Inc.) | 0.05 g |
| γ-butylactone | 6 g |
| methylethyl ketone | 8 g |
| 1-methoxy-2-propanol | 6 g |

COMPARATIVE EXAMPLE 1

A lithographic printing plate was obtained by applying the following photosensitive liquid 6 onto the obtained substrate such that the applied amount was 1.8 $g/m^2$.

| Photosensitive liquid 6 | |
|---|---|
| copolymer 3 [component (A), I/O value: 1.49] | 1.0 g |
| cyanine dye B [component (B + C), I/O value: 1.49] | 0.1 g |
| p-toluene sulfonic acid | 0.002 g |
| dye prepared by replacing the counter anion of Victoria Pure Blue BOH with an anion of 1-naphthalenesulfonic acid | 0.02 g |
| fluorine-containing surfactant (Megafac F-177, manufactured by Dainippon Ink & Chemicals, Inc.) | 0.05 g |
| γ-butylactone | 8 g |
| methylethyl ketone | 8 g |
| 1-methoxy-2-propanol | 4 g |

COMPARATIVE EXAMPLE 2

A lithographic printing plate was obtained by applying the following photosensitive liquid 7 onto the obtained substrate such that the applied amount was 1.8 $g/m^2$.

| Photosensitive liquid 7 | |
|---|---|
| m,p-cresol novolak (m/p ratio = 6/4, weight-average molecular weight: 3500, non-reacted cresol was contained in an amount of 0.5% by weight) [component (A), I/O value = 0.72] | 0.86 g |
| copolymer 1 (component (A), I/O value: 1.55] | 0.14 g |
| cyanine dye A [component (B + C), I/O value: 0.84] | 0.1 g |
| p-toluene sulfonic acid | 0.002 g |
| dye prepared by replacing the counter anion of Victoria Pure Blue BOH with an anion of 1-naphthalenesulfonic acid | 0.02 g |
| fluorine-containing surfactant (Megafac F-177, manufactured by Dainippon Ink & Chemicals, Inc.) | 0.05 g |
| γ-butylactone | 8 g |
| methylethyl ketone | 8 g |
| 1-methoxy-2-propanol | 4 g |

COMPARATIVE EXAMPLE 3

A lithographic printing plate was obtained by applying the following photosensitive liquid 8 onto the obtained substrate such that the applied amount was 1.8 $g/m^2$.

| Photosensitive liquid 8 | |
|---|---|
| m,p-cresol novolak (m/p ratio = 6/4, weight-average molecular weight: 3500, non-reacted cresol was contained in an amount of 0.5% by weight) [component (A), I/O value = 0.72] | 0.75 g |
| copolymer 2 [component (A), I/O value: 1.18] | 0.26 g |
| cyanine dye A [component (B + C), I/O value: 0.84] | 0.1 g |
| p-toluene sulfonic acid | 0.003 g |
| dye prepared by replacing the counter anion of Victoria Pure Blue BOH with an anion of 1-naphthalenesulfonic acid | 0.02 g |
| fluorine-containing surfactant (Megafac F-177, manufactured by Dainippon Ink & Chemicals, Inc.) | 0.05 g |
| γ-butylactone | 6 g |
| methylethyl ketone | 8 g |
| 1-methoxy-2-propanol | 6 g |

COMPARATIVE EXAMPLE 4

A lithographic printing plate was obtained by applying the following photosensitive liquid 9 onto the obtained substrate such that the applied amount was 1.8 $g/m^2$.

| Photosensitive liquid 9 | |
|---|---|
| m,p-cresol novolak (m/p ratio = 6/4, weight-average molecular weight: 3500, non-reacted cresol was contained in an amount of 0.5% by weight) [component (A), I/O value = 0.72] | 1.0 g |
| cyanine dye F [component (B + C), I/O value: 2.00] | 0.2 g |
| dye prepared by replacing the counter anion of Victoria Pure Blue BOH with an anion of 1-naphthalenesulfonic acid | 0.02 g |
| fluorine-containing surfactant (Megafac F-177, manufactured by Dainippon Ink & Chemicals, Inc.) | 0.05 g |
| γ-butylactone | 3 g |
| methylethyl ketone | 8 g |
| 1-methoxy-2-propanol | 7 g |

cyanine dye F

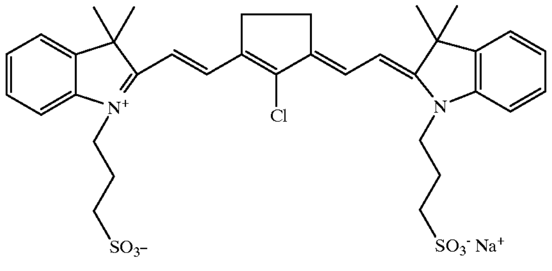

COMPARATIVE EXAMPLE 5

A lithographic printing plate was obtained by applying the following photosensitive liquid 10 onto the obtained substrate such that the applied amount was 1.8 $g/m^2$.

| Photosensitive liquid 10 | |
|---|---|
| copolymer 1 [component (A), I/O value: 1.55] | 1.0 g |
| cyanine dye G [component (B + C), I/O value: 0.59] | 0.1 g |
| p-toluene sulfonic acid | 0.002 g |
| dye prepared by replacing the counter anion of Victoria Pure Blue BOH with an anion of 1-naphthalenesulfonic acid | 0.02 g |
| fluorine-containing surfactant (Megafac F-177, manufactured by Dainippon Ink & Chemicals, Inc.) | 0.05 g |
| γ-butylactone | 8 g |
| methylethyl ketone | 8 g |
| 1-methoxy-2-propanol | 4 g |

cyanine dye G

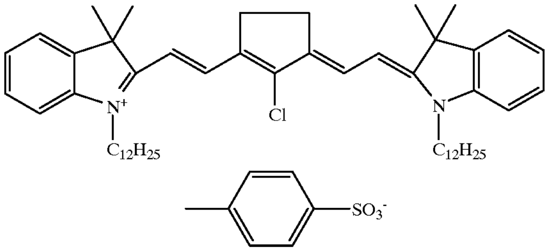

| Carbon Black Dispersed Liquid | |
|---|---|
| carbon black | 1 part by weight |
| copolymer of benzylmethacrylate and methacrylic acid (mole ratio: 72:28, average molecular weight: 70000) | 1.6 parts by weight |
| cyclohexanone | 1.6 parts by weight |
| methoxypropyl acetate | 3.8 parts by weight |

EXAMPLE 6

A lithographic printing plate was obtained in the same manner as in Example 1, except that the cyanine dye A used in photosensitive liquid 1 was replaced with 0.5 g of the carbon black dispersed liquid [component (C)], and that 0.2 gof diphenyl sulfone [component (B), I/O value: 0.60] was newly added.

COMPARATIVE EXAMPLE 6

A lithographic printing plate was obtained in the same manner as in Example 1, except that 0.45 g of an ester compound of naphthoquinone-1,2-diazido-5-sulfonyl chloride and pyrogallol-acetone resin, which is disclosed in Example 1 of U.S. Pat. No. 3,635,709 (I/O value: 0.89, thermal decomposition temperature: 130° C.), was newly added into the photosensitive liquid 1.

COMPARATIVE EXAMPLE 7

A lithographic printing plate was obtained in the same manner as in Example 2, except that 0.3 g of an ester compound of 2,3,4-trihydroxybenzophenone and naphthoquinone-1,2-diazido-5-sulfonylchloride (I/O value: 0.89, thermal decomposition temperature: 130° C.) was newly added into the photosensitive liquid 2.

COMPARATIVE EXAMPLE 8

A lithographic printing plate was obtained in the same manner as in Example 3, except that 0.3 g of an ester compound of naphthoquinone-1,2-diazido-5-sulfonylchloride and pyrogallol-acetone resin, which is disclosed in Example 1 of U.S. Pat. No. 3,635,709 (I/O value: 0.89, thermal decomposition temperature: 130° C.), was newly added into the photosensitive liquid 3.

COMPARATIVE EXAMPLE 9

A lithographic printing plate was obtained in the same manner as in Example 4, except that 0.3 g of an ester compound of 2,3,4-trihydroxybenzophenone and naphthoquinone-1,2-diazido-5-sulfonylchloride (I/O value: 1.06, thermal decomposition temperature: 130° C.) was newly added into the photosensitive liquid 4.

COMPARATIVE EXAMPLE 10

A lithographic printing plate was obtained in the same manner as in Example 5, except that 0.3 g of an ester compound of 2,3,4-trihydroxybenzophenone and naphthoquinone-1,2-diazido-5-sulfonylchloride (I/O value: 1.06, thermal decomposition temperature: 130° C.) was newly added into the photosensitive liquid 5.

[Evaluation of Performance of the Lithographic Printing Plate]

The performance of the lithographic printing plates of Examples 1–5 and Comparative Examples 1–10, which were produced as described above, was evaluated in accordance with the following criteria. The results of the evaluation are shown in Table 1.

[Sensitivity and Development Latitude]

Each of the obtained lithographic printing plates was exposed at a main scanning speed of 5 m/second, by using a semiconductor laser having an output power of 500 mW, a wavelength of 830 nm and a beam diameter of 17 μm ($1/e^2$), and then was developed by an automatic developing machine "PS Processor 900VR" (manufactured by Fuji Photo Film Co., Ltd.) in which a developing solution "DP-4" (manufactured by Fuji Photo Film Co., Ltd.) and a rinsing liquid FR-3 (manufactured by Fuji Photo Film Co., Ltd.) [dilution ratio with water:1:7] were used. The following two types of solutions were used as the developing solution: DP-4 diluted 8 times, and DP-4 diluted 12 times. The pattern width of the non-image portions obtained with each of the developing solutions was measured, and then the irradiation energy of the laser corresponding to the pattern width was obtained as a measure of sensitivity. The difference between the sensitivity obtained with the developing solution diluted 8 times, which was a standard, and that obtained with the developing solution diluted 12 times was calculated. The smaller the difference, the better the development latitude. Differences of 20 $mJ/cm^2$ or less are regarded as levels which can be used in actual practice.

TABLE 1

| | I/O value of Component (A) | I/O value of Component (B) or (B + C) | Absolute Value of Difference in I/O Values of Both Components | Compound whose Decomposition Temperature is 150° C. or Less | Sensitivity ($mJ/cm^2$) DP-4 (1:8) | DP-4 (1:12) | Development Latitude (1:12)–(1:8) |
|---|---|---|---|---|---|---|---|
| Example 1 | 0.72 | 0.84 | 0.12 | None | 150 | 160 | 10 |
| Example 2 | 1.55 | 1.49 | 0.06 | None | 140 | 150 | 10 |
| Example 3 | 1.18 | 1.49 | 0.31 | None | 160 | 170 | 10 |
| Example 4 | 1.30 | 0.84 | 0.46 | None | 150 | 150 | 0 |
| Example 5 | 1.04 | 0.84 | 0.20 | None | 160 | 180 | 20 |
| Example 6 | 0.72 | 0.60 | 0.12 | None | 150 | 160 | 10 |
| Comparative Example 1 | 1.49 | 1.49 | 0 | None | 160 | 220 | 60 |
| Comparative Example 2 | 0.84 | 0.84 | 0 | None | 170 | 240 | 130 |
| Comparative Example 3 | 0.84 | 0.84 | 0 | None | 150 | 230 | 80 |
| Comparative Example 4 | 0.72 | 2.00 | 1.28 | None | 160 | 240 | 140 |
| Comparative Example 5 | 1.55 | 0.59 | 0.96 | None | 170 | 230 | 60 |
| Comparative Example 6 | 0.72 | 0.87 | 0.15 | present | 180 | 320 | 140 |
| Comparative Example 7 | 1.55 | 1.17 | 0.38 | present | 150 | 330 | 50 |
| Comparative Example 8 | 1.18 | 1.04 | 0.14 | present | 160 | 350 | 100 |
| Comparative Example 9 | 1.38 | 1.01 | 0.37 | present | 170 | 310 | 70 |
| Comparative Example 10 | 1.04 | 1.01 | 0.03 | present | 180 | 350 | 170 |

From Table 1, it can be understood that the lithographic printing plates according to the present invention have superior development latitude as compared to Comparative Examples 1–5 in which the relationship between the I/O values of component (A) and component (B) did not fall in the range stipulated in the present invention. It can also be understood that the lithographic printing plates of Comparative Examples 6–10, in which the relationship between the I/O values of the (A) and components (B) was within the scope of the present invention but a thermal decomposition compound was added, were not sufficiently decomposed by the laser having the aforementioned output power, such that the sensitivities were low and the development latitudes were inferior.

In accordance with the positive photosensitive composition for an infrared laser of the present embodiment, the image forming ability of the alkali aqueous solution soluble polymer compound is improved, and places in which the composition can be handled are no longer limited. Furthermore, stability of the sensitivity against changes in the concentration of the developing solution, that is, the development latitude, is good. Thus, the composition has good sensitivity for computer-to-plate printing, and can be preferably used for computer-to-plate printing.

The second embodiment according to the present invention will be described in detail hereinafter.

[Compounds Represented by the General Formula (D)]

The compounds represented by the general formula (D) in the present embodiment are fatty acids (so-called "waxes") having many carbon atoms, and derivatives thereof.

In general formula (D), $R^1$ represents an alkyl group or alkenyl group having 6–32 carbon atoms. The alkyl group or alkenyl group may be branched. Examples of the alkyl group include normal (straight-carbon-chain) alkyl groups such as n-hexyl group, n-heptyl group, n-octyl group, n-nonyl group, n-decyl group and n-.undecyl group; and branched alkyl groups such as 14-methylpentadecyl group and 16-methylheptadecyl group. Examples of the alkenyl group include 1-hexenyl group, 1-heptenyl group, 1-octenyl group and 2-methyl-1-heptenyl group. Among these, alkyl groups and alkenyl groups having 25 or fever carbon atoms are preferred from the standpoint of their solubility in the solvent for application or coating.

$R^2$ and $R^3$ represent a hydrogen atom, an aryl group or alkenyl group or alkyl group which has 1–18 carbon atoms.

The alkyl group and alkenyl group may be branched and may have a substituent. Examples of such an alkyl group include methyl group, ethyl group, n-hexyl group, n-nonyl group, benzyl group, cyclohexylmethyl group and the like. Examples of the alkenyl group include propylenyl group, 1-butenyl group, 1-isobutenyl group, 1-pentenyl group, 3-methyl-1-butenyl group, 1-hexenyl group, 1-octenyl group and the like.

The aryl group may have a substituent, and examples thereof are phenyl group, 4-hydroxyphenyl group, cyclohexyl phenyl group, and the like.

X represents O, S or $NR^3$. In short, the compounds represented by general formula (D) are fatty acids, esters of fatty acids, thioesters of fatty acids, or amides of fatty acids.

Specific examples of the compounds represented by general formula (D) include: fatty acids such as enanthic acid, caprylic acid, pelargonic acid, capric acid, undecylic acid, lauric acid, tridecylic acid, myristic acid, pentadecylic acid, palmitic acid, heptadecylic acid, stearic acid, nonadecanic acid, arachic acid, behenic acid, lignoceric acid, cerotic acid, heptacosanic acid, montan acid, melissic acid, lacceric acid, undecylenic acid, oleic acid, elaidic acid, cetoleic acid, erucic acid, and brassidic acid; esters of fatty acids such as methyl esters, ethyl esters, propyl esters, butyl esters, dodecyl esters, phenyl esters and naphthyl esters of the aforementioned fatty acids; thioesters of fatty acids such as methyl thioesters, ethyl thioesters, propyl thioesters, butyl thioesters, and benzyl thioesters of the aforementioned fatty acids; and amides of fatty acids such as amides, methyl amides and ethylamides of the aforementioned fatty acids.

The compound represented by the general formula (D) may be used alone, or a combination of two or more of the compounds represented by general formula (D) may be used. The added amount of the compound represented by the general formula (D) is from 0.02 to 10 weight %, preferably from 0.2 to 10 weight %, and especially preferably from 2 to 10 weight % of the entire amount of solids in the printing plate material. If the added amount of the compound is less than 0.02% by weight, stability of developability deteriorates in cases in which the plate is scratched. If the added amount of the compound is more than 10% by weight, the amount has exceeded the saturation level and will not contribute to any further effects. Thus, addition of the compound in more than this amount is unnecessary.

[Alkali Aqueous-solution Soluble Compound Having a Phenolic Hydroxide Group]

The alkali aqueous solution soluble resin which has a phenolic hydroxide group and is used in the present embodiment (which will be referred to hereinafter as the "resin having a phenolic hydroxide group") may be, for example, a Novolak resin such as phenol formaldehyde resin, m-cresol formaldehyde resin, p-cresol formaldehyde resin, mixed m-/p-cresol formaldehyde resin, phenol/cresol (any one of m-, p-, and mixed m-/p-)-mixed formaldehyde resin, or the like.

The resin having a phenolic hydroxide group preferably has a weight-average molecular weight of from 500 to 20000, and number-average molecular weight of from 200 to 10000.

As described in the specification of U.S. Pat. No. 4,123,279, together with the resin having a phenolic hydroxide group, there may be used a condensed compound of formaldehyde and phenol having, as a substituent, an alkyl group having 3–8 carbon atoms, such as t-butylphenolformaldehyde resin or octylphenolformaldehyde resin. The resin having a phenolic hydroxide group may be used alone, or two or more of such resins may be used.

In the present embodiment, it is preferable to use together the resin having a phenolic hydroxide group, and a copolymer containing, as a copolymerized component(s), 10 mole % or more of at least one functional group selected from aforementioned (a) to (c). The copolymer will be hereinafter referred to as the "specific copolymer".

The specific copolymer of the present embodiment must comprise, as a copolymerized components), 10 mole % or more, and preferably 20 mole % or more, of at least one selected from (a) to (c). If this amount is less than 10 mole %, the specific copolymer does not interact sufficiently with the resin having a phenolic hydroxide group and thus the development latitude is low.

Copolymerizable components other than (a), (b), and (c) may be contained in the specific copolymer.

The monomer corresponding to (a) is a monomer which is a low molecular weight compound comprising at least one sulfonamide group in which at least one hydrogen atom is bonded to the nitrogen atom, and at least one unsaturated group which can be polymerized. Among such monomers, preferred are low molecular weight compounds having an acryloyl group, allyl group or vinyloxy group, and a substituted or mono-substituted aminosulfonyl group or a substituted sulfonylimino group.

Examples of such a compound include compounds represented by the following general formulae (I)–(V).

(I)

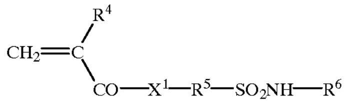

(II)

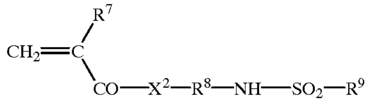

(III)

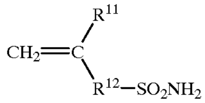

(IV)

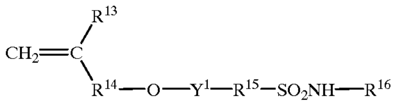

(V)

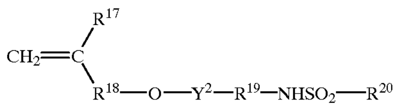

in which $X^1$ and $X^2$ each independently represent —O— or —$NR^{10}$—; $R^4$ and $R^7$ each independently represent a hydrogen atom or —$CH_3$; $R^5$, $R^8$, $R^{12}$, $R^{15}$ and $R^{19}$ each independently represent an alkylene group, cycloalkylene group, arylene group or aralkylene group, each of which has 1–12 carbon atoms and may have a substituent; $R^6$, $R^{10}$ and $R^{16}$ represent a hydrogen atom or an alkyl group, cycloalkyl group, aryl group or aralkyl group, each of which has 1–12 carbon atoms and may have a substituent; $R^9$ and $R^{20}$ each independently represent an alkyl group, cycloalkyl group, aryl group or aralkyl group, each of which has 1–12 carbon atoms and may have a substituent; $R^{11}$, $R^{13}$ and $R^{17}$ represent a hydrogen atom or —$CH_3$; $R^{14}$ and $R^{18}$ each independently represent an alkylene group, cycloalkylene group, arylene group or aralkylene group, each of which has 1–12 carbon atoms and may have a single bond or a substituent; and $Y^1$ and $Y^2$ each independently represent a single bond or —CO—.

Specifically, m-aminosulfonylphenylmethacrylate, N-(p-aminosulfonylphenyl)methacrylimide, N-(p-aminosulfonylphenyl)acrylamide, or the like may preferably be used.

The monomer corresponding to (b) is a monomer which is a low molecular weight compound comprising in the molecule at least one active imino group represented by the aforementioned formula 2 and at least one unsaturated group which can be polymerized.

As this compound, specifically, N-(p-toluenesulfonyl) metharylimide, N-(p-toluenesulfonyl) acrylimide, or the like can preferably be used.

The monomer corresponding to (c) is a monomer formed of acrylamide, methacrylamide, ester of acrylic acid, ester of methacrylic acid or hydroxystyrene, each of which has a phenolic hydroxide group.

Specific, preferred examples of this compound(c) which can be used include N-(4-hydroxyphenyl)acrylamide, N-(4-hydroxyphenyl)methacrylamide, o-hydroxyphenylacrylate, m-hydroxyphenylacrylate, p-hydroxyphenylacrylate, o-hydroxyphenylmethacrylate, m-hydroxyphenylmethacrylate, p-hydroxyphenylmethacrylate, o-hydroxystyrene, m-hydroxystyrene, and p-hydroxystyrene.

Other copolymerized components which can be used may be, for example, monomers listed in the following (1)–(12):

(1) acrylic esters and methacrylic esters having an aliphatic hydroxyl group such as 2-hydroxyethylacrylate, 2-hydroxyethylmethacrylate, (2) alkylacrylates such as methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate, and N-dimethylaminoethyl acrylate, (3) alkylmethacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate, and N-dimethylaminoethyl methacrylate, (4) acrylamides or methacrylamides such as acrylamide, methacrylamide, N-methylolacrylamide N-ethylacrylamide, N-hexylmethacrylamide, N-cyclohexylacrylamide, N-hydroxyethylacrylamide, N-phenylacrylamide, N-nitrophenylacrylamide, N-ethyl-N-phenylacrylamide, (5) vinyl ethers such as ethylvinyl ether, 2-chloroethylvinyl ether, hydroxyethylvinyl ether, propylvinyl ether, butylvinyl ether, octylvinyl ether, and phenylvinyl ether, (6) vinyl esters such as vinyl acetate, vinyl chloroacetate, vinyl butyrate, and vinyl benzoate, (7) styrenes such as styrene, a -methylstyrene, methylstyrene, and chloromethylstyrene, (8) vinyl ketones such as methylvinyl ketone, ethylvinyl ketone, propylvinyl ketone, and phenylvinyl ketone, (9) olefins such as ethylene, propylene, isobutylene, butadiene, and isoprene,

(10) N-vinylpyrrolidone, N-vinylcarbazole, 4-vinylpyridine, acrylonitrile, and methacrylonitrile,

(11) unsaturated imides such as maleimide, N-acryloylacrylamide, N-acetylmethacrylamide, n-propionylmethacrylamide and N-(p-chlorobenzoyl) methacrylamide,

(12) unsaturated carboxylic acids such as acrylic acid, methacrylic acid, maleic anhydride, and itaconic acid.

The specific copolymer in the present embodiment preferably has a weight-average molecular weight of 2000 or more and a number-average molecular weight of 1000 or more, and more preferably has a weight-average molecular weight of from 5000 to 300000, a number-average molecular weight of from 2000 to 250000, and a dispersion degree (weight-average molecular weight/number-average molecular weight) of from 1.1 to 10.

The specific copolymer may be used alone, or two or more specific copolymers may be used.

The composition weight ratio of the resin having a phenolic hydroxide group to the specific copolymer is preferably from 50:50 to 5:95, and is more preferably from 40:60 to 10:90.

If the amount of the resin having a phenolic hydroxide group is greater than that defined above, the sea-island structure of the composition is structurally reversed so that it becomes difficult to overcome problems related to the high dissolubility in the solvent and the like. On the other hand, if the amount of the specific copolymer is greater than the that defined above, the surface layer comprising the resin having a phenolic hydroxide group becomes too thin to improve the development latitude sufficiently.

The alkali aqueous solution soluble polymer compound comprising the resin having a phenolic hydroxide group and the specific copolymer may be used alone, or a combination of two or more types may be used. The amount thereof is from 30 to 99 weight %, preferably from 40 to 95 weight %, and especially preferably from 50 to 90 weight % of the entire content of solids in the printing plate material. If the added amount of the alkali aqueous solution soluble polymer compound is less than 30 weight %, the durability of the recording layer deteriorates. If it is more than 99 weight %, both the durability and sensitivity deteriorate

[Material generating heat by absorbing light]

In the present embodiment, the material generating heat by absorbing light which can be used may be any of various types of pigments or dyes.

The pigments which can be used include commercially available pigments, and pigments described in the Color Index (C. I.) Handbook, "Latest Pigment Handbook" (edited by the Japan Pigment Technical Association, published in 1977), "Latest Pigment Applied Technology" (CMC Publications, published in 1986) and "Printing Ink Technology" (CMC Publications, published in 1984).

The types of the pigments which can be used include black pigments, yellow pigments, orange pigments, brown pigments, red pigments, violet pigments, blue pigments, green pigments, fluorescent pigments, metallic powdery pigments, or polymer-bonded colorants. Specific examples are insoluble azo pigments, azo lake pigments, condensed azo pigments, chelate azo pigments, phthalocyanine-based pigments, anthraquinone-based pigments, perylene or perynone-based pigments, thioindigo-based pigments, quinacridone-based pigments, dioxazine-based pigments, isoindlinone-based pigments, quinophthalone-based pigments, vat dycing lake pigments, azine pigments, nitroso pigments, nitro pigments, natural pigments, fluorescent pigments, inorganic pigments and carbon black.

These pigments may be used with or without being subjected to surface treatment. Methods for surface treatment include methods of applying a surface coat of resin or wax, methods of applying surfactant, and methods of bonding a reactive material (for example, a silane coupling agent, an epoxy compound, and polyisocyanate, or the like) to the surface of the pigment particle. These methods for surface treatment are described in "Properties and Application of Metallic Soap" (published by Saiwai Shobo), "Printing Ink Technology" (CMC Publications, published in 1984) and "Latest Pigment Applied Technology" (CMC Publications, published in 1986).

The particle size of the pigment is preferably from 0.01 to 10 $\mu$m, more preferably from 0.05 to 1 $\mu$m and especially preferably from 0.1 to 1 $\mu$m. A particle size of the pigment of less than 0.01 $\mu$m is not preferred because of deteriorated stability of the dispersed pigment in a photosensitive layer coating liquid. A particle size of more than 10 $\mu$m is not preferred, either, because of deteriorated uniformity of the photosensitive layer.

As the method for dispersing the pigment, any known dispersing techniques which are used for the production of ink, toner or the like may be used. Dispersing devices for the dispersion include an ultrasonic dispersing device, a sand mill, an attritor, a pearl mill, a super mill, a ball mill, an impeller, a disperser, a KD mill, a colloid mill, a dynatron, a three-roll mill, and a press kneader. Details thereof are described in "Latest Pigment Applied Technology" (CMC Publications, published in 1986).

The dyes which can be used may be any known dyes, such as commercially available dyes or dyes described in, for example, "Dye Handbook" (edited by the Organic Synthetic Chemistry Association, published in 1970). Specific examples thereof include azo dyes, azo metal complex salt dyes, pyrazolone azo dyes, anthraquinone dyes, phthalocyanine dyes, carbonium dyes, quinoneimine dyes, methine dyes, cyanine dyes, and the like.

In the present embodiment, among these pigments and dyes, those which absorb infrared or near infrared rays are especially preferred because of their suitability for use with lasers emitting infrared or near infrared rays.

A pigment which absorbs infrared or near infrared rays and which can be suitably used in the present embodiment is carbon black. Dyes absorbing infrared or near infrared rays are, for example, cyanine dyes disclosed in JP-A Nos. 58-125246, 59-84356, 59-202829, and 60-78787; methine dyes disclosed in JP-A Nos. 58-173696, 58-181690, and 58-194595; naphthoquinone dyes disclosed in JP-A Nos. 58-112793, 58-224793, 59-48187, 59-73996, 60-52940 and 60-63744; squarylium colorant disclosed in JP-A No. 58-112792; and cyanine dyes disclosed in U.K Patent No. 434,875.

Examples of dyes which can be suitably used are the near infrared ray absorbing sensitizers disclosed in U.S. Pat. No. 5,156,938. Examples of dyes which are especially preferably used are substituted arylbenzo(thio)pyrylium salts described in U.S. Pat. No. 3,881,942; trimethinethia pyrylium salts described in JP-A No. 57-142645 (U.S. Pat. No. 4,327,169); pyrylium-based compounds described in JP-A Nos. 58-181051, 58-220143, 59-41363, 59-84248, 59-84249, 59-146063, and 59-146061; cyanine colorant described in JP-A No. 59-216146; pentamethinethiopyrylium salts described in U.S. Pat. No. 4,283,475; and pyrylium compounds, Epolight III-178, Epolight III-130 and Epolight III-125 described in JP-B No. 5-13514 and 5-19702.

Another example of especially preferred dyes is the near infrared ray absorbing dyes represented by formulas (I) and (II) in U.S. Pat. No. 4,756,993.

The pigments or dyes may be added into the material for the printing plate in an amount of from 0.01 to 50 weight %, preferably from 0.1 to 10 weight %, and especially preferably from 0.5 to 10 weight % (in the case of the dye) and from 3.1 to 10 weight % (in the case of the pigment), with respect to the entire amount of solids in the material for the printing plate. If the pigment or dye content is less than 0.01 weight %, sensitivity is lowered. If this content is more than 50 weight %, uniformity of the photosensitive layer is lost and durability of the recording layer deteriorates.

The dye or pigment may be added into the same layer as the other components, or may be added in a different layer. In the case of using a different layer, the different layer is preferably a layer adjacent to the layer containing the compound of the present embodiment which is thermally decomposable and which substantially lowers the solubility of the binder when the substance is not in a decomposed state. The dye or pigment, and the binder resin are preferably contained in the same layer, but may be contained in different layers.

[Other Components]

Various additives may be optionally added into the positive photosensitive composition according to the present embodiment. For improvement in preventing the dissolving of the image portion into the developing solution, it is preferable to added a thermally-decomposable substance which substantially lowers the solubility of the alkali aqueous solution soluble polymer compound when the substance is not in a decomposed state, such as onium salts, o-quinonediazide compounds, aromatic sulfone compounds and esters of aromatic sulfonic acids.

Examples of the onium salts include diazonium salt, ammonium salt, phosphonium salt, iodonium salt, sulfonium salt, selenonium salt and arsonium salt or the like.

Preferred onium salts which can be used in the present embodiment are, for example, diazonium salts described in S. I. Schlesinger, Photogr. Sci. Eng., 18, 387 (1974), T. S. Bal et al., Polymer, 21423 (1980), and JP-A No. 5-158230; ammonium salts described in U.S. Pat. Nos. 4,069,055 and 4,069,056, and JP-A No. 3-140140; phosphonium salts described in D. C. Necker et al., Macromolecules, 17, 2468 (1984), C. S. Wen et al., Teh. Proc. Conf. Rad. Curing ASIA, P.478, Tokyo, (Oct. 1988), U.S. Pat. Nos. 4,069,055 and 4,069,056; iodonium salts described in J. V. Crivello et al., Macromolecules, 10 (6), 1307 (1977), Chem. &Eng. News, P.31, (Nov. 28, 1988) EP No. 104,143, U.S. Pat. Nos. 339,049, 410,201, JP-A Nos. 2-150848 and 2-296514; sulfonium salts described in J. V. Crivello et al., Polymer J. 17, 73 (1985), J. V. Crivello et al., J. Org. Chem., 43 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14 (5), 1141 (1981), J. V. Crivello et al., J. Polymer Sci., Polymer Chem. Ed., 17, 2877 (1979), EP Nos. 370,693, 233,567, 297,443, 297,442, U.S. Pat. Nos. 4,933,377, 3,902,114, 410,201, 339,049, 4,760,013, 4,734,444, 2,833,827, West German Patent Nos. 2,904,626, 3,604,580, 3,604,581; selenonium salts described in J. V. Crivello et al., Macromolecules, 10(6), 1307 (1977), J. V. Crivello et al., J. Polymer Sci., Polymer Chem. Ed., 17, 1047 (1979); and arsonium salts described in C. S. Wen et al., Teh, Proc. Conf. Rad. Curing ASIA, P.478, Tokyo, (Oct. 1988).

In the present embodiment, diazonium salts are especially preferred. Especially preferred diazonium salts are, for example, those described in JP-A No. 5-158230.

Preferred quinonediazides are, for example, o-quinonediazide compounds.

The o-quinonediazide compounds which can be used in the present embodiment are compounds which have at least one o-quinonediazide group and whose solubility in an alkali aqueous solution increases by thermal decomposition. Such compounds may be have various structures. Herein, the o-quinonediazide compounds exhibit the two features that the o-quinonediazide compound is thermally decomposed to lose the ability to restrain the solubility of the binder, and that the o-quinonediazide compound itself is changed into an alkali aqueous solution soluble material. In short, the o-quinonediazide compounds, when decomposed, improve the solubility of the photosensitive materials due to these two features. The o-quinonediazide compounds which can be used in the present embodiment may be, for example, compounds described in J. Koser "Light-Sensitive Systems" (John Wiley & Sons. Inc.) pp. 339–352. Especially preferred are sulfonic esters or sulfonic amides of o-quinonediazide which have been reacted with various aromatic polyhydroxy compounds or aromatic amino compounds. Also, there may be preferably used: esters obtained by reacting pyrogallol-acetone resin with benzoquinone (1,2)-diazidesulfonic chloride or naphthoquinone-(1,2)-diazide-5-sulfonic chloride, described in JP-B No. 43-28403; and esters obtained by reacting phenol-formaldehyde resin with benzoquinone-(1,2)-diazidesulfonic chloride or naphthoquinone- (1,2)-diazide-5-sulfonic chloride, described in U.S. Pat. Nos. 3,046,120 and 3,188,210.

Furthermore, there may be preferably used: esters obtained by reacting phenolformaldehyde resin or cresol-formaldehyde resin with naphthoquinone-(1,2)-diazide-4-sulfonic chloride; and esters obtained by reacting pyrogallol-acetone resin with naphthoquinone-(1,2)-diazide-4-sulfonic chloride. Other useful o-quinonediazide compounds are described in, for example, JP-A Nos. 47-5303, 48-63802, 48-63803, 48-96575, 49-38701, 48-13354, JP-B Nos. 41-11222, 45-9610, 49-17481, U.S. Pat. Nos. 2,797,213, 3,454,400, 3,544,323, 3,573,917, 3,674,495, 3,785,825, UKP Nos. 1,227,602, 1,251,345, 1,267,005, 1,329,888, 1,330,932, and German Patent No. 854,890.

The added amount of the o-quinonediazide compound is preferably from 1 to 50 weight %, more preferably from 5 to 30 weight %, and especially preferably from 10 to 30 weight % of the entire content of solids in the material for the printing plate. These compounds may be used alone, or a combination of two or more types may be used.

The counter ion of the onium salt may be tetrafluoroboric acid, hexafluorophosphoric acid, triisopropylnaphthalene-sulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzene-sulfonic acid, 1-naphthol-5-sulfonic acid, 2-methoxy-4-hydroxy-5-benzoyl-benzenesulfonic acid, and p-toluenesulfonic acid. Among these, preferred are alkylaromatic sulfonic acids such as hexafluorophosphoric acid, triisopropylnaphthalenesulfonic acid and 2,5-dimethylbenzenesulfonic acid.

The amount of added compounds other than o-quinonediazide compound is preferably from 1 to 50 weight %, more preferably from 5 to 30 weight %, and especially preferably from 10 to 30 weight %. The additive (s) and the binder resin in the present embodiment are preferably contained in the same layer.

Cyclic acid anhydrides, phenols and organic acids may be used to further improve sensitivity. Examples of the cyclic acid anhydrides include phthalic anhydride, tetrahydrophthalic anhydride, hexahydrophthalic anhydride, 3,6-endooxy-$\Delta_4$-tetrahydrophthalic anhydride, tetrachlorophthalic anhydride, maleic anhydride, chloromaleic anhydride, a-phenylmaleic anhydride, succinic anhydride, pyromellitic anhydride, or the like which are mentioned in U.S. Pat. No. 4,115,128. Examples of the phenols include bisphenol A, p-nitrophenol, p-ethoxyphenol, 2,4,4'-trihydroxybenzophenone, 2,3,4-trihydroxybenzophenone, 4-hydroxybenzophenone, 4,4',4", -trihydroxytriphenylmethane, and 4,4',3",4"-tetrahydroxy-3, 5,3',5', -tetramethyltriphenylmethane or the like. Examples of the organic acids include sulfonic acids, sulfinic acids, alkylsulfuric acids, phosphonic acids, phosphoric esters and carboxylic acids or the like as described in JP-A Nos. 60-88942 and 2-96755, and specifically include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, ascorbic acid, and the like.

The amount of the cyclic acid anhydrides, phenols or organic acids is preferably from 0.05 to 20 weight %, more preferably from 0.1 to 15 weight % and especially preferably from 0.1 to 10 weight % of the material for the printing plate.

A nonionic surfactant as described in JP-A Nos. 62-251740 and 3-208514, or an amphoteric surfactant as described in JP-A Nos. 59-121044 and 4-13149 may be added in the material for the printing plate according to the present embodiment, in order to ensure stable processing for different developing solution conditions.

Specific examples of the nonionic surfactant include sorbitan tristearate, sorbitan monopalmitate, sorbitan trioleate, monoglyceride stearate, and polyoxyethylenenonylphenylether.

Specific examples of the amphoteric surfactant include alkyldi(aminoethyl)glycine, alkylpolyaminoethylglycine hydrochloride, 2-alkyl-N-carboxyethyl-N-hydroxyethylimidazolynium betaine and N-tetradecyl-N,N-betaine (trade name: Amogen, manufactured by Dai-ichi Kogyo K. K.). The amount of the nonionic or amphoteric surfactant is preferably from 0.05 to 15 weight % and more preferably from 0.1 to 5 weight % of the material for the printing plate.

A printout agent for obtaining a visible image immediately after heating caused by exposure, or a dye or pigment as an image colorant, may be included in the material for the printing plate according to the present invention.

A representative example of the printout agent is a combination of a compound which can release an acid by heating caused by exposure and an organic dye which can form a salt by reacting with the acid-releasing agent. Specific examples of the printout agent include a combination of o-naphthoquinonediazide-4-sulfonic halogenide and a salt-forming organic dye which combination is described in JP-A No. 50-36209 and 53-8128, and a combination of a trihalomethyl compound and a salt-forming organic dye which combination is described in JP-A Nos. 53-36223, 54-74728, 60-3626, 61-143748, 61-151644 and 63-58440. Among trihalomethyl compounds, there are oxazole-based compounds and triazine-based compounds. Both have excellent-stability over time so as to provide clear printout images.

As an image colorant, dyes other than the aforementioned salt forming organic dyes may be used. In addition to the salt forming organic dyes, other preferred dyes are oil-soluble dyes and basic dyes. Specific examples include Oil-Yellow #101, Oil Yellow #103, Oil Pink #312, Oil Green BG, Oil Blue BOS, Oil Blue #603, Oil Black BY, Oil Black BS, Oil Black T-505 (all of which are manufactured by Orient Chemical Industries Co., Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015), or the like. The dyes disclosed in JP-A No. 62-293247 are especially preferred. The dye may be included in the material for the printing plate in an amount of from 0.01 to 10 weight %, and preferably from 0.1 to 3 weight % of the entire content of solids in the material for the printing plate. A plasticizer for providing the formed film with softness may be optionally added in the material for the printing plate in the present embodiment. Examples of the plasticizer which may be used include monobutyl phthalate, polyethyleneglycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomer or polymer of acrylic acid or methacrylic acid.

The image recording material (printing plate) according to the present embodiment can generally be produced by dissolving compounds containing the aforementioned respective components into a solvent and then applying the solution onto an appropriate substrate. Examples of the solvent used herein include ethylenedichloride, cyclohexanone, methylethyl ketone, methanol, ethanol, propanol, ethyleneglycolmonomethylether, 1-methoxy-2-propanol, 2-methoxyethyl acetate, 1-methoxy-2-propyl acetate, dimethoxyethane, methyl lactate, ethyl lactate, N,N-dimethylacetoamide, N,N-dimethylformamide, tetramethylurea, N-methylpyrrolidone, dimethylsulfoxide, sulfolane, γ-butyrolactone, toluene, and the like. However, the solvent is not limited to these examples. The solvent may be used alone, or a combination of two or more of these solvents can be used. The concentration of the aforementioned components (i.e., all of the solid components including the additives) in the solvent is preferably from 1 to 50% by weight. The applied amount (of the solid components) on the substrate obtained after application and drying may vary in accordance with purpose of use, but in general, it is preferably from 0.5 to 5.0 $g/m^2$ for the photosensitive printing plate. The method for applying the solution may be any of various methods, for example, bar coater coating, rotating coating, spray coating, curtain coating, dip coating, air knife coating, blade coating, and roll coating. The less the amount applied to the substrate, the higher the apparent sensitivity, but the worse the film characteristics of the photosensitive film.

A surfactant for improving the applying (coating) property, for example, any of the fluorine-containing surfactants described in JP-A No. 62-170950, may be added to the photosensitive layer in the present embodiment. The amount of the surfactant added is preferably from 0.01 to 1 weight % and more preferably from 0.05 to 0.5 weight % of the entire material for the printing plate.

The substrate which is used in the present embodiment is a plate-like object having stable dimensions, and may be, for example, paper; paper on which plastic such as polyethylene, polypropylene, polystyrene or the like is laminated; a metal plate such as an aluminum, zinc or copper plate; a plastic film formed of, for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, or polyvinyl acetal; a paper or a plastic film on which the aforementioned metal is vapor-deposited or laminated; or the like.

As the substrate in the present embodiment, a polyester film or an aluminum plate is preferred, and an aluminum plate is especially preferred because of its stable dimensions and relatively low cost. A preferable aluminum plate is a pure aluminum plate or is an alloy plate comprising aluminum as the main component and a very small amount of a different element. A plastic film on which aluminum is laminated or vapor-deposited may be used. Examples of the different elements which may be contained in the aluminum alloy are silicon, iron, manganese, copper, magnesium, chromium, zinc, bismuth, nickel, titanium, and the like. The content of the different elements in the alloy is to be 10% by weight or less. As described above, an especially preferable aluminum in the present embodiment is pure aluminum. However, from the standpoint of refining techniques, it is difficult to prepare a completely pure aluminum. Therefore, an aluminum containing a very small amount of different elements may be used. In short, the composition of the aluminum plate applied to the present embodiment is not specified, and the aluminum plate may be any conventionally known aluminum plate. The thickness of the aluminum plate used in the present embodiment is from about 0. 1 to 0.6 mm, preferably from 0.15 to 0.4 mm, and especially preferably from 0.2 to 0.3 mm.

Before making the surface of the aluminum plate rough, if desired, the surface maybe subjected to a degreasing treatment with, for example, a surfactant, organic solvent or alkali aqueous solution, to remove rolling oil from the surface.

The treatment for roughening the surface of the aluminum plate may be carried out in any of various ways such as, for example, a method of mechanically roughening the surface, a method of electrochemically melting the surface and making it rough, and the method of chemically and selectively melting the surface. The mechanical method may be any known method such as ball polishing, brush polishing, blast polishing, buff polishing, or the like. The electrochemical method of making the surface rough may be a method of applying alternate or direct current to the surface in an electrolytic solution of hydrochloric acid or nitric acid. A combination of both mechanical and electrochemical methods may be used, as disclosed in JP-A No. 54-63902.

The aluminum plate whose surface has been roughened as described above is optionally subjected to an alkali etching treatment and a neutralizing treatment, and then, if desired, is subjected to anodic oxidization treatment for improving the water holding property and wear resistance of the surface. The electrolyte which is used in the anodic oxidization treatment of the aluminum plate may be any of various electrolytes which can form a porous oxidized film, and in general, sulfuric acid, phosphoric acid, oxalic acid, chromic acid, or mixtures thereof may be used. The concentration of the electrolyte is determined appropriately in accordance with the type of electrolyte.

The anodic oxidization treatment conditions cannot be specified because they vary in accordance with the type of electrolyte. In general, however, it is appropriate for the concentration of the electrolyte in the solution to be from 1 to 80 weight %, the temperature of the solution to be from 5 to 70° C., the current density to be 5 to 60 $A/dm^2$, the voltage to be from 1 to 100 V, and the time for the electrolysis to be from 10 seconds to 5 minutes.

If the amount of the anodically oxidized film is less than 1.0 $g/m^2$, the wear resistance of the plate is insufficient, or it is easy for scratches to be formed at the non-image portions on the lithographic printing plate such that it is easy for so-called "scratch stains" to be formed, i.e., ink adhering to the scratches at the time of printing.

After being subjected to the anodically oxidization treatment, the surface of the aluminum is optionally subjected to a hydrophilization treatment. The hydrophilization treatment which is used in the present invention may be an alkali metal silicate (e.g., an aqueous solution of sodium silicate) process as disclosed in U.S. Pat. Nos. 2,714,066, 3,181,461, 3,280,734 and 3,902,734. In this process, the substrate is dipped in an aqueous solution of sodium silicate, or is electrolyzed therein. Or, it is possible to use the processes of treating the surface with potassium fluorozirconate as described in JP-B-No. 36-22063, or with polyvinylphosphonic acid as disclosed in U.S. Pat. Nos. 3,276,868, 4,153,461, and 4,689,272.

The image recording material in the present embodiment is a material in which the positive-type material for a printing plate is disposed on a substrate. However, an undercoat layer may be provided between the substrate and the positive-type material as needed.

Various organic compounds may be used as the undercoat layer components, such as carboxymethylcellulose; dextrin; arabia rubber; phosphonic acids having an amino group such as 2-aminoethylphosphonic acid; organic phosphonic acids such as phenylphosphonic acid, naphthylphosphonic acid, alkylphosphonic acid, glycerophosphonic acid, methylenediphosphonic acid and ethylenediphosphonic acid, each of which may have a substituent; organic phosphoric acids such as phenylphosphioric acid, naphthylphosphoric acid, alkylphosphoric acid and glycerophosphoric acid, each of which may have a substituent; organic phosphinic acids such as phenylphosphinic acid, naphthylphosphinic acid, alkylphosphinic acid and glycerophosphinic acid, each of which may have a substituent; amino acids such as glycine and β-alanine; and a hydrochloride of an amine having a hydroxy group such as a hydrochloride of triethanol amine. A single organic compound may be used, or a combination of two or more may be used.

The organic undercoat layer can be formed by either of the following methods:a method of applying, to the aluminum plate, a solution in which the aforementioned organic compound is dissolved in water or in an organic solvent such as methanol, ethanol or methylethyl ketone, or a mixed solution thereof, and the applied solution is dried; or a method of dipping the aluminum plate into a solution in which the aforementioned organic compound is dissolved in water or in an organic solvent such as methanol, ethanol or methylethyl ketone, or a mixed solution thereof so as to cause the plate to absorb the aforementioned compound, and then the plate is washed with water and dried so as to form the organic undercoat layer. In the former method, a solution having a concentration of the aforementioned organic compound of from 0.005 to 10 weight % can be applied in any of various manners. In the latter method, the concentration of the organic compound is from 0.01 to 20 weight %, and preferably from 0.05 to 5 weight %, and the dipping temperature is from 20 to 90° C. and preferably from 25 to 50° C., and the dipping time is 0.1 seconds to 20 minutes, and preferably from 2 seconds to 1 minute. The value of the pH of the solution used herein can be adjusted within the range from 1 to 12, with basic substances such as ammonia, triethylamine or potassium hydroxide, or acidic substances such as hydrochloric acid or phosphoric acid. A yellow dye may be added to the solution to improve color tone reproducibility of the image recording material.

The amount of the applied organic undercoat layer is suitably from 2 to 200 mg/m$^2$, and preferably from 5 to 100 mg/m$^2$. If this amount is less than 2 mg/m$^2$ or more than 200 mg/m$^2$, sufficient wear resistance of the plate cannot be obtained.

The positive image recording material produced as described above is usually subjected to image-exposure and developing processings.

The light source for an active light beam which is used in the image-exposure maybe, for example, a mercury lamp, a metal halide lamp, a xenone lamp, a chemical lamp, a carbon arc lamp or the like. Examples of radiation which can be used include an electron beam, an X ray, an ion beam, and a far infrared ray or the like. There may also be used a g-line, an i-line, a deep-UV light, or a high density energy beam (a laser beam). The laser beam may be a helium/neon laser, an argon laser, a krypton laser, a helium/cadmium laser, and a KrF excimer laser or the like.

In the present embodiment, a light source emitting light having a luminous wavelength within the range from the near infrared wavelength region to the infrared wavelength region is preferred, and especially preferred is a solid state laser or a semiconductor laser.

The developing solution and replenishing solution for the image recording material of the present embodiment may be a conventionally known alkali aqueous solution such as, for example, solutions of inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide, and lithium hydroxide; and organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine.

The alkali agent may be used alone, or a combination of two or more may be used.

Among these, especially preferred developing solutions are aqueous solutions of silicates, such as sodium silicate and potassium silicate. This is because developability can be adjusted by changing the ratio of silicon dioxide ($SiO_2$) and alkali metal oxides $M_2O$ and/or the concentrations of silicon dioxide and the alkali metal oxides (silicon dioxide and alkali metal oxides are the main components of a silicate). For example, alkali metal salts of silicic acid as described in JP-A No. 54-62004 and JP-B No. 57-7427 are effectively used.

It is known that when development is carried out by using an automatic developing machine, an aqueous solution (a replenishing solution) having a higher basicity than that of the developing solution is added to the developing solution so that many PS plates can be processed without having to replace the developing solution in the developing tank for a long time. In the present embodiment, such a replenishing manner is preferably used. Various surfactants or organic solvents may be optionally added to the developing solution and the replenishing solution to accelerate or control developability, to improve the dispersibility of development-scum, and to improve the affinity of image portions on the printing plate with ink. The surfactant is preferably an anionic, cationic, nonionic, or amphoteric surfactant. A reducing agent such as hydroquinone, resorcine, a sodium salt or potassium salt of an inorganic acid such as sulfurous acid or sulfurous hydracid; an organic carboxylic acid; an antifoamer, or a hard-water softener may be added to the developing solution and the replenishing solution as needed.

The printing plate developed with the developing solution and the replenishing solution is post-treated with water; a rinsing solution containing, for example, a surfactant; and a desensitizing solution containing gum arabic or a starch derivative various combinations of these treatments can be used as the post-processing carried out when the image recording material of the present embodiment is used as a printing plate.

Recently, in the printing plate manufacturing and printing industries, for the efficiency and standardization of plate-manufacturing works there have been widely used automatic developing machines for printing plates. The automatic developing machine generally comprises a developing section and a post-processing section, and specifically comprises a device for conveying a printing plate, tanks for various processings, and a spray device, in which various processing solutions pumped up by a pump are sprayed on an exposed printing plate from spray nozzles while the plate is fed horizontally, so as to develop the printing plate. Recently, there has also been known a method in which a printing plate is processed by being immersed and conveyed in tanks filled with various processing solutions by means of guide rolls or the like disposed in the solutions. Such automatic processing may be carried out while replenishing solutions are being replenished into the respective processing solutions in accordance with the processed amount or the working time.

A so-called disposable processing method, in which processing is carried out with processing solutions which are virtually unused, can be used.

A case in which the image recording material according to the present embodiment is used as a photosensitive lithographic printing plate will now be described. In a case in which a lithographic printing plate obtained by image-exposure, development, washing with water, and/or rinsing, and/or rubber-coating has unnecessary image portions, such as traces of film edges of an original film, such unnecessary image portions are to be removed. It is preferred that the removal is carried out by applying a removing solution such as that described in JP-B No. 2-13293 onto the unnecessary image portions, allowing the printing plate to stand for a given period, and then washing the printing plate with water. However, the method disclosed in JP-A No. 59-174842 may be used in which the unnecessary image portions are irradiated with an active light beam guided through an optical fiber, and the printing plate is developed thereafter.

The lithographic printing plate obtained as described above, which may be optionally coated with desensitizing rubber, is subjected to a printing process. If a lithographic printing plate with higher plate wear resistance is desired, the plate is subjected to a burning treatment.

In the case of burning the lithographic printing plate, it is preferable to treat the plate with a surface-adjusting liquid such as those disclosed in JP-B Nos. 61-2518 and 55-28062, and JP-A Nos. 62-31859 and 61-159655, before the burning treatment.

Examples of methods of treating the lithographic printing plate with a surface-adjusting liquid include a method of applying the surface-adjusting liquid onto the lithographic printing plate with a sponge or a absorbent cotton which has absorbed the surface-adjusting liquid, a method of immersing the printing plate into a vat filled with the surface-adjusting liquid so as to coat the plate with the liquid, and a method of applying the surface-adjusting liquid with an automatic coater. Better results can be obtained if the amount of the surface-adjusting liquid is made uniform over the entire surface with a squeegee or squeeze rollers.

It is appropriate that the amount of the applied surface-adjusting liquid is generally from 0.03 to 0.8 $g/m^2$ (dry weight).

The lithographic printing plate coated with the surface-adjusting liquid is dried and, if necessary, it is heated to high temperature with a burning processor, for example, a "BP-1300" burning processor sold by Fuji Photo Film Co., Ltd. The heating temperature and the heating time in this step are varied in accordance with the types of components forming the image, but are preferably from 180 to 300° C. and 1 to 20 minutes, respectively.

If necessary, the lithographic printing plate subjected to the burning treatment may further be subjected to conventional treatments such as washing with water and rubber-coating. However, if a surface-adjusting liquid containing a water-soluble polymer compound or the like is used, a desensitizing treatment such as rubber-coating can be omitted.

Examples of the present embodiment will be described hereinafter, but the present invention is not limited to these examples.

SYNTHESIS OF SPECIFIC COPOLYMER

SYNTHESIS OF EXAMPLE 1 (SPECIFIC COPOLYMER 1)

Into a 500 ml three-neck flask with a stirrer, a condenser and a dropping funnel, 31.0 g (0.36 mole) of methacrylic acid, 39.1 g (0.36 mole) of ethyl chloroformate, and 200 ml of acetonitrile were added, and then the mixture was stirred while being cooled in an ice bath. Through the dropping funnel, 36.4 g (0.36 mole) of triethylamine was added by drops into this mixture over about 1 hour. After this addition, the ice bath was removed, and then the mixture was stirred at room temperature for 30 minutes.

Into this reaction mixture, 51.7 g (0.30 mole) of p-aminobenzenesulfonamide was added, and then the mixture was stirred for 1 hour while being heated in an oil bath at 70° C. After the reaction was finished, this mixture was added to 1 liter of water while the water was stirred, and then the resultant mixture was stirred for 30 minutes. This mixture was filtered to remove the precipitates. The precipitate was mixed with 500 ml of water to obtain a slurry, and then the slurry was filtered. The obtained solid was dried to yield a white solid of N-(p-aminosulfonylphenyl) methacrylamide (yield: 46.9 g)

Into 20 ml three-neck flask with a stirrer, a condenser and a dropping funnel were added 4.61 g (0.0192 mole) of N-(p-aminosulfonylphenyl)methacrylamide, 2.94 g (0.0258 mole) of ethyl methacrylate, 0.80 g (0.015 mole) of acrylonitrile, and 20 g of N,N-dimethylacetamide, and then the mixture was stirred while being heated at 65° C. in a hot water bath. Into this mixture, 0.15 g of "V-65" (manufactured by Wako Junyaku K. K.) was added, and then the mixture was stirred in a nitrogen gas flow for 2 hours while a temperature of 65° C. was maintained. Into this reaction mixture, a mixture of 4.61 g of N-(p-aminosulfonylphenyl)methacrylamide, 2.94 g of ethyl methacrylate, 0.80 g of acrylonitrile, 20 g of N,N-dimethylacetamide; and 0.15 g of "V-65" was added dropwise through the dropping funnel over 2 hours. After the dropwise addition was finished, the resultant mixture was stirred at 65° C. for 2 hours. After the reaction was finished, 40 g of methanol was added into the mixture, and the mixture was cooled. The obtained mixture was added into 2 liters of water while the water was stirred, and then the resultant mixture was stirred for 30 minutes. Thereafter, the precipitates were removed by filtration, and then dried to obtain 15 g of a white solid. The weight-average molecular weight (polystyrene reference) of the resultant specific copolymer 1 was measured by gel permeation chromatography, and found to be 53,000.

[Production of Substrate]

An aluminum plate (material quality: 1050) having a thickness of 0.3 mm was washed with trichloroethylene to remove grease, and then the surface was made coarse with a nylon brush and a 400 mesh pumice-water suspension, and then sufficiently washed with water. This plate was dipped into a 25% sodium hydroxide aqueous solution at 45° C. for 9 seconds to be etched. After the plate was washed with water, it was dipped into 20% nitric acid for 20 seconds, and then washed with water. The etched amount of the coarse surface was about 3 $g/m^2$. By direct current-anodic oxidization at a current density of $15A/dM^2$ and using 7% sulfuric acid as an electrolytic solution, a direct current anodically oxidized film of 3 $g/dm^2$ was formed on the plate. Thereafter, the plate was washed with water, and dried. Then, the following undercoat liquid was applied to the plate, and the applied film was dried at 90° C. for 1 minute. The amount of the applied film after drying was 10 $mg/m^2$.

| Undercoat liquid | | |
|---|---|---|
| β-Alanine | 0.5 | g |
| Methanol | 95 | g |
| Water | 5 | g |

Furthermore, the resultant plate was treated with an aqueous solution of 2.5% by weight of sodium silicate at 30° C. for 10 seconds. The following undercoat liquid was applied thereon, and the applied film was dried at 80° C. for 15 seconds, such that a substrate was obtained. The amount of the applied layer after drying was 15 mg/m$^2$.

| Undercoat liquid | | |
|---|---|---|
| The following compound | 0.3 | g |
| Methanol | 100 | g |
| Water | 1 | g |

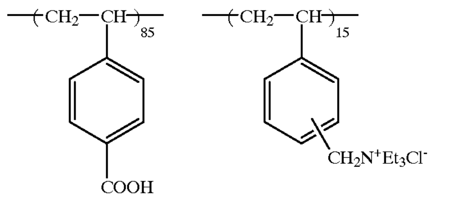

molecular weight 28,000

EXAMPLE 1

The following photosensitive liquid 1 containing 0.03 g of capric acid as a compound represented by above-described general formula (D) was prepared. A lithographic printing original plate ("herein original plate" means "raw" plate before exposure) was obtained by applying photosensitive liquid 1 onto the obtained substrate such that the applied amount was 1.8 g/m$^2$.

| Photosensitive liquid 1 | | |
|---|---|---|
| capric acid | 0.03 | g |
| specific copolymer 1 | 0.75 | g |
| m,p-cresol novolak (m/p ratio = 6/4, weight-average molecular weight: 3500, non-reacted cresol was contained in an amount of 0.5% by weight) | 0.25 | g |
| p-toluenesulfonic acid | 0.003 | g |
| tetrahydrophthalic anhydride | 0.03 | g |
| cyanine dye A (having the following structure) | 0.017 | g |
| dye prepared by replacing the counter anion of Victoria Pure Blue BOH with an anion of 1-naphthalenesulfonic acid | 0.015 | g |
| Megafac F-177 (fluorine-containing surfactant manufactured by Dainippon Ink & Chemicals, Inc.) | 0.05 | g |
| γ-butylactone | 10 | g |
| methylethyl ketone | 10 | g |
| 1-methoxy-2-propanol | 1 | g |

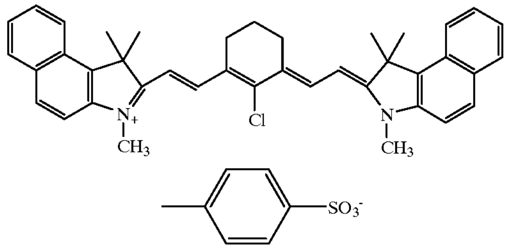

The developabilities of the resultant lithographic printing original plates in cases in which scratches were formed on their surfaces were experimentally evaluated. Results of the evaluations are shown Table 2.

(Developability when Scratches are Made on the Surface)

Each of the obtained lithographic printing plates was exposed at a main scanning speed of 5 m/second, by using a semiconductor laser having an outputting power of 500 mW, a wavelength of 830 nm and a beam diameter of 17 μm (1/ e$^2$). A continuous load-applying type scratch strength tester "SB62" (manufactured by Shinto Kagaku K. K.) was readied. A filter paper "No. 5C" (manufactured by Advantec Toyo Co.) was attached to a 1 cm$^2$ planar portion of a scratching tool of the "SB62" tester, which planar portion was to hit the printing plate. Then, by the scratch strength tester the lithographic printing plate was scratched at a speed of 6 cm/second while a 100 g load was applied thereon. Subsequently, the plate was developed with a developing solution "DP-4" [dilution ratio of 1:8] (manufactured by Fuji Photo Film Co., Ltd.) for 30 seconds. Evaluation was carried out in accordance with the following criteria.

X: The photosensitive film was completely dissolved at the scratched portion.

Δ: The photosensitive film was partially dissolved at the scratched portion.

○: The photosensitive film was not dissolved at the scratched portion.

TABLE 2

| | Compound Represented by General Formula (D) | Developability in a case in which the Surface is Scratched |
|---|---|---|
| Example 1 | capric acid | ○ |
| Example 2 | stearic acid | ○ |
| Example 3 | phenyl Stearate | ○ |
| Example 4 | n-dodecyl stearate | ○ |
| Example 5 | n-butyl stearate | ○ |
| Example 6 | stearoylmethylamide | ○ |
| Example 7 | behenic acid | ○ |
| Example 8 | behenic amide | ○ |
| Example 9 | stearic benzylmercaptoester | ○ |
| Comparative Example 1 | valeric acid | X |
| Comparative Example 2 | ethyl valerate | X |
| Comparative Example 3 | None | X |

EXAMPLE 2

A lithographic printing original plate was obtained in the same manner as in Example 1, except that 0.03 g of stearic acid was used as the compound represented by general formula (D) The developability of the obtained lithographic printing original plate in a case in which scratches were formed on its surface was evaluated in the same manner as in Example 1. The results of the evaluation are shown in Table 2.

EXAMPLE 3

A lithographic printing original plate was obtained in the same manner as in Example 1, except that 0.03 g of phenyl stearate was used as the compound represented by general formula (D) The developability of the obtained lithographic printing original plate in a case in which scratches were formed on its surface was evaluated in the same manner as in Example 1. The results of the evaluation are shown in Table 2.

EXAMPLE 4

A lithographic printing original plate was obtained in the same manner as in Example 1, except that 0.03 g of n-dodecyl stearate was used as the compound represented by general formula (D). The developability of the obtained lithographic printing original plate in a case in which scratches were formed on its surface was evaluated in the same manner as in Example 1. The results of the evaluation are shown in Table 2.

EXAMPLE 5

A lithographic printing original plate was obtained in the same manner as in Example 1, except that 0.03 g of n-butyl stearate was used as the compound represented by general formula (D) The developability of the obtained lithographic printing original plate in a case in which scratches were formed on its surface was evaluated in the same manner as in Example 1. The results of the evaluation are shown in Table 2.

EXAMPLE 6

A lithographic printing original plate was obtained in the same manner as in Example 1, except that 0.03 g of stearoylmethylamide was used as the compound represented by general formula (D) The developability of the obtained lithographic printing original plate in a case in which scratches were formed on its surface was evaluated in the same manner as in Example 1. The results of the evaluation are shown in Table 2.

EXAMPLE 7

A lithographic printing original plate was obtained in the same manner as in Example 1, except that 0.03 g of behenic acid was used as the compound represented by general formula (D) The developability of the obtained lithographic printing original plate in a case in which scratches were formed on its surface was evaluated in the same manner as in Example 1. The results of the evaluation are shown in Table 2.

EXAMPLE 8

A lithographic printing plate was obtained in the same manner as in Example 1, except that 0.03 g of behenic amide was used as the compound represented by general formula (D). The developability of the obtained lithographic printing plate in the case in which scratches were formed on its surface was evaluated in the same manner as in Example 1. The. results of the evaluation are shown in Table 2.

EXAMPLE 9

A lithographic printing plate was obtained in the same manner as in Example 1, except that 0.03 g of stearic benzylmercaptoester was used as the compound represented by general formula (D). The developability of the obtained lithographic printing plate in a case in which scratches were formed on its surface was evaluated in the same manner as in Example 1. The results of the evaluation are shown in Table 2.

COMPARATIVE EXAMPLE 1

A lithographic printing plate was obtained in the same manner as in Example 1, except that 0.03 g of valeric acid was added instead of capric acid. The developability of the obtained lithographic printing plate in a case in which scratches were formed on its surface was evaluated in the same manner as in Example 1. The results of evaluation are shown in Table 2.

COMPARATIVE EXAMPLE 2

A lithographic printing plate was obtained in the same manner as in Example 1, except that 0.03 g of ethyl valerate was added instead of capric acid. The developability of the obtained lithographic printing plate in a case in which scratches were formed on its surface was evaluated in the same manner as in Example 1. The results of the evaluation are shown in Table 2.

COMPARATIVE EXAMPLE 3

A lithographic printing plate was obtained in the same manner as in Example 1, except that capric acid was not added. The developability of the obtained lithographic printing plate in a case in which scratches were formed on its surface was evaluated in the same manner as in Example 1. The results of the evaluation are shown in Table 2.

From Table 2, it can be understood that addition of the compound represented by general formula (D) results in a remarkable improvement in developability in a case in which the surface is scratched, in the state before the lithographic printing plate is developed.

In accordance with the present embodiment, it is possible to provide a positive photosensitive composition for use with an infrared laser, which composition is used for a "computer-to-plate" system and which is stable in the state before development and thus has an excellent handling property.

What is claimed is:

1. A method for forming a positive image comprising:

exposing a photosensitive lithographic printing plate with an infrared laser in the range of 700 to 1200 nm, said photosensitive lithographic printing plate comprising a substrate and a positive photosensitive composition thereon, said positive photosensitive composition comprising:

an alkali aqueous solution soluble polymer compound (A), a compound (F) which is compatible with the alkali aqueous solution soluble polymer compound, thereby lowering the solubility of the alkali aqueous solution soluble polymer compound in an alkali aqueous solution, the effect of lowering the solubility being reduced by heating, the compound (F) further having the properties of generating heat upon absorption of light, having a light absorbing band outside the range of 350 nm to 500 nm and being other than an onium salt or a quinonediazide compound wherein the thermal decomposition temperature of each of compound (A) and compound (F) is higher than 150° C.; and developing the photosensitive lithographic printing with an alkali aqueous solution, so that the exposed portions of the photosensitive lithographic printing plate are dissolved into the alkali aqueous solution.

2. A method according to claim 1, wherein the alkali aqueous solution soluble polymer compound (A) comprises one or more alkali aqueous solution soluble polymer compounds having at least one group selected from the following functional groups (a-1) (a-2) and (a-3):

| | |
|---|---|
| a phenolic hydroxide group | (a-1), |
| a sulfonamide group | (a-2), |
| ac active imide group | (a-3). |

3. A method according to claim 2, wherein the alkali aqueous solution soluble polymer compound (A) comprises a resin having a phenolic hydroxide group (a-1), and a specific copolymer containing, as a copolymerized component, 10 mole % or more of at least one group selected from (a-1), (a-2) and (a-3).

4. A method according to claim 3, wherein the specific copolymer contains, as a copolymerized component, 20 mole % or more of at least one group selected from (a-1), (a-2) and (a-3).

5. A method according to claim 3, wherein when the resin having a phenolic hydroxide group (a-1) and the specific copolymer form a copolymer, the composition weight ratio of the resin to the specific copolymer is from 50:50 to 5:95.

6. A method according to claim 1, wherein the I/O value of the alkali aqueous solution soluble polymer compound (A) is X and, the compound (F) has an I/O value (Y) satisfying the relationship represented by following inequality (1):

$$0.05 \leqq |X-Y| \leqq 0.05 \quad (1)$$

wherein I/O is a measure of hydrophilicity and hydrophobicity.

7. A method according to claim 1, wherein a material for printing plate is formed by applying the positive photosensitive composition onto a substrate, and the alkali aqueous solution soluble polymer compound (A) is contained in an amount of from 30 to 99 weight %, of an entire content of solids in the material for a printing plate.

8. A method according to claim 1, wherein the photosensitive lithographic printing plate is formed by applying the positive photosensitive composition onto a substrate, and the alkali aqueous solution soluble polymer compound (A) is contained in an amount of from 40 to 95 weight % of an entire content of solids in the material for a printing plate.

9. A method according to claim 1, wherein the photosensitive lithographic printing plate is formed by applying the positive photosensitive composition onto a substrate, and the alkali aqueous solution soluble polymer compound (A) is contained in an amount of from 50 to 90 weight % of an entire content of solids in the material for a printing plate.

10. A method according to claim 1, wherein the compound (F) is represented by the following general formula (I):

General formula (I)

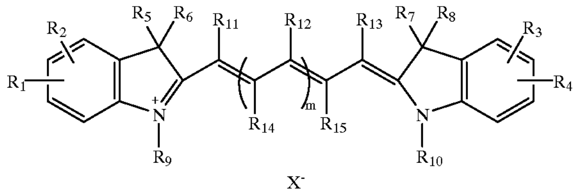

wherein $R^1$–$R^4$ each independently represent an alkyl group, alkenyl group, alkoxy group, cycloalkyl group, or aryl group, each of which has 1–12 carbon atoms and may have a substituent; $R^1$ and $R^2$ may be bonded together to form a ring structure; $R^3$ and $R^4$ may be bonded together to form a ring structure; $R^5$–$R^{10}$ each independently represent an alkyl group which has 1–12 carbon atoms and may have a substituent; $R^{11}$–$R^{13}$ each independently represent a hydrogen atom, a halogen atom, or an alkyl group which has 1–8 carbon atoms and may have a substituent; $R^{12}$ may be bonded to $R^1$ or $R^{13}$ to form a ring structure; when m is greater than 2, a plurality of the $R^{12}$ may be bonded to each other to form a ring structure; $R^4$–$R^{15}$ each independently represent a hydrogen atom, a halogen atom, or an alkyl group which has 1–8 carbon atoms and may have a substituent; $R^{14}$ may be bonded to $R^{15}$ to form a ring structure; when m is greater than 2, a plurality of the $R^{14}$ may be bonded to each other to form a ring structure; m is an integer from 1 to 8; and X represents an anion.

11. A method according to claim 10, wherein the compounds represented by general formula (I) are cyanine dyes, and are represented by the following formulas:

cyanine dye A

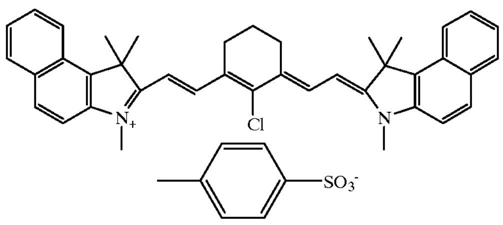

cyanine dye B

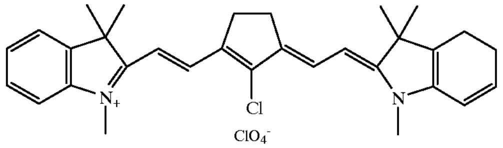

cyanine dye C

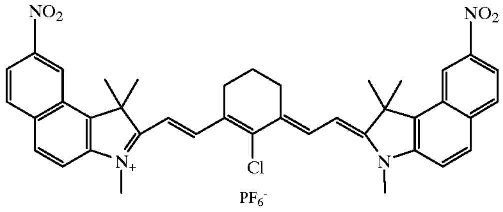

-continued cyanine dye D

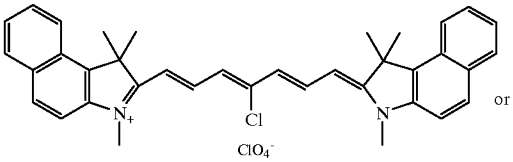

or cyanine dye E

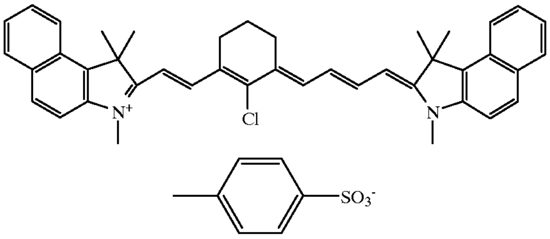

12. A method according to claim 1, wherein the weight ratio amounts of compound (F) to the compound (A) is from 99/1 to 70/30.

13. A method for forming a positive image comprising:

exposing a photosensitive lithographic printing plate with an infrared laser in the range of 700 to 1200 nm, said photosensitive lithographic printing plate comprising a substrate and a positive photosensitive composition thereon, said positive photosensitive composition comprising:

(i) a compound which generates heat upon absorption of light;

(ii) an alkali aqueous solution soluble resin having a phenolic hydroxide group;

(iii) a copolymer containing, as a copolymerized component, 10 mole % or more of at least one selected from following (a), (b) and (c):

a monomer (a) having in one molecule thereof a sulfonamide group wherein at least one hydrogen atom is bonded to the nitrogen atom;

a monomer (b) having in one molecule thereof an active imino group represented by the following formula:

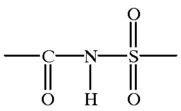

a compound (c) selected from the group consisting of acrylamide, methacrylamide, esters of acrylic acid, esters of methacrylic acid, and hydroxystyrene, each of which has a phenolic hydroxide group; and (iv) a compound represented by following general formula (D):

$$R^1CO—X—R^2 \qquad (D)$$

wherein X represents O, S or $NR^3$; $R^1$ represents an alkyl group or alkenyl group which has 6–32 carbon atoms; $R^2$ and $R^3$ represent a hydrogen atom, or an alkyl group or alkenyl group or aryl group each of which has 1–18 carbon atoms; and developing the photosensitive lithographic printing with an alkali aqueous solution, so that the exposed portions of the photosensitive lithographic printing plate are dissolved into the alkali aqueous solution.

14. A method according to claim 13, wherein, when the photosensitive composition is applied to a substrate and is dried so as to form a plate material on the substrate, the compound (D) rises up to the surface of the plate material and forms a film which functions as a protective film thereat.

15. A method according to claim 13, wherein a single compound represented by general formula (D) or a combination of two or more compounds represented by general formula (D) are used, a material for printing plate is formed by applying the positive photosensitive composition onto a substrate, and a total added amount of compound or compounds represented by general formula (D) is in an amount of 0.02 to 10 weight % of an entire content of solids in the material for the printing plate.

16. A method according to claim 13, wherein the resin having a phenolic hydroxide group has a weight-average molecular weight of from 500 to 20000 and a number-average molecular weight of from 200 to 10000.

17. A method according to claim 13, wherein the copolymer has a weight-average molecular weight of 2000 or a number-weight molecular weight of 1000 or more, and more and has a dispersion degree (weight-average molecular weight/number-weight molecular weight) of from 1.1 to 10.

18. A method according to claim 13, wherein the composition weight ratio of the resin having a phenolic hydroxide group to the copolymer is from 50:50 to 5:95.

19. A method according to claim 13, wherein the copolymer has a weight-average molecular weight of 5000–300000 and a number-weight molecular weight of 2000–250000 and has a dispersion degree (weight-average molecular weight/number-weight molecular weight) of from 1.1 to 10.

* * * * *

UNITED STATES PATENT AND TRADEMARK OFFICE

CERTIFICATE OF CORRECTION

PATENT NO. : 6,346,365 B1 Page 1 of 1
DATED : February 12, 2002
INVENTOR(S) : Ikuo Kawauchi et al.

It is certified that error appears in the above-identified patent and that said Letters Patent is hereby corrected as shown below:

Column 49,
Line 40, change "$0.05 \leqq |X - Y| \leqq 0.05$" to -- $0.05 \leqq |X - Y| \leqq 0.5$ --.

Signed and Sealed this

Seventeenth Day of August, 2004

JON W. DUDAS
*Acting Director of the United States Patent and Trademark Office*